US007875935B2

(12) United States Patent
Manabe

(10) Patent No.: US 7,875,935 B2
(45) Date of Patent: Jan. 25, 2011

(54) SEMICONDUCTOR DEVICE AND METHOD FOR MANUFACTURING THE SAME

(75) Inventor: Kenzo Manabe, Tokyo (JP)

(73) Assignee: NEC Corporation, Tokyo (JP)

( * ) Notice: Subject to any disclaimer, the term of this patent is extended or adjusted under 35 U.S.C. 154(b) by 144 days.

(21) Appl. No.: 12/310,774

(22) PCT Filed: Jun. 4, 2007

(86) PCT No.: PCT/JP2007/061267

§ 371 (c)(1), (2), (4) Date: Mar. 6, 2009

(87) PCT Pub. No.: WO2008/035490

PCT Pub. Date: Mar. 27, 2008

(65) Prior Publication Data

US 2009/0321839 A1 Dec. 31, 2009

(30) Foreign Application Priority Data

Sep. 20, 2006 (JP) ............................ 2006-254194

(51) Int. Cl.

*H01L 29/76* (2006.01)
*H01L 29/94* (2006.01)
*H01L 31/062* (2006.01)
*H01L 31/113* (2006.01)
*H01L 31/119* (2006.01)
*H01L 21/8238* (2006.01)

(52) U.S. Cl. ............... 257/369; 438/199; 257/E21.632; 257/E27.062

(58) Field of Classification Search ................. 257/369, 257/E21.632, E27.062; 438/199
See application file for complete search history.

(56) References Cited

U.S. PATENT DOCUMENTS 6,599,831 B1 7/2003 Maszara et al.

(Continued)

FOREIGN PATENT DOCUMENTS

JP 2005-129551 5/2005

(Continued)

OTHER PUBLICATIONS

Pawlak et al. "Modulation of the Workfunction of Ni Fully Silicided Gates by Doping: Dielectric and Silicide Phase Effects" : IEEE Electron Device Letters, vol. 27, No. 2 (Feb. 2006), p. 99-101, full text, Figs. 1 to 3.

(Continued)

*Primary Examiner*—David S Blum
(74) *Attorney, Agent, or Firm*—McGinn IP Law Group, PLLC

(57) ABSTRACT

A semiconductor device includes a silicon substrate; an N-channel field-effect transistor including a first gate insulating film on the silicon substrate, a first gate electrode on the first gate insulating film and a first source/drain region; and a P-channel field-effect transistor including a second gate insulating film on the silicon substrate, a second gate electrode on the second gate insulating film and a second source/drain region. Each of the first and second gate electrodes includes a crystallized nickel silicide region containing an impurity element, the crystallized nickel silicide region being contact with the first or second gate insulating film, and a barrier layer region in an upper portion including an upper surface of the gate electrode, the barrier layer region containing an Ni diffusion-preventing element higher in concentration than that of a lower portion below the upper portion.

20 Claims, 15 Drawing Sheets

U.S. PATENT DOCUMENTS

| | | | | |
|---|---|---|---|---|
| 2005/0070062 | A1 | 3/2005 | Visokay et al. | |
| 2006/0084247 | A1 * | 4/2006 | Liu | 438/510 |

FOREIGN PATENT DOCUMENTS

| | | |
|---|---|---|
| JP | 2005-524243 | 8/2005 |
| JP | 2005-252192 | 9/2005 |
| JP | 2005-294360 | 10/2005 |
| JP | 2006-108355 | 4/2006 |
| JP | 2006-147828 | 6/2006 |
| JP | 2006-196646 | 7/2006 |
| WO | WO 03/094243 A1 | 11/2003 |
| WO | WO 2006/001271 A1 | 1/2006 |

OTHER PUBLICATIONS

Oh et al. "Novel Nitrogen Doped Ni Self-Alingned Silicide Process for Nanoscale Complementary Metal Oxide Semiconductor Technology" : Jpn. J. Appl. Phys., vol. 44, No. 4B (2005), pp. 2142-2146, full text, Figs. 1 to 9.

Nobuyuki Mise et al., "Chisso O Tenka shita Ni Spatter ni yoru Epitaxial NiSi2 no Teion Keisei" : Dai 53 Kai Oyo Butsurigaku Kankei Rengo Koenkei Koen Yokoshu No. 2 (Mar. 22, 2006), p. 929.

JaeHoon Lee et al., "Tunable Work Function Dual Metal Gate Technology for Bulk and Non-Bulk CMOS", International Electron Devices Meeting Technical Digest 2002, p. 359.

Hwa Sung Rhee, et al., "Negative Bias Temperature Instability of Carrier-Transport Enhanced pMOSFET with Performance Boosters", International Electron Devices Meeting Technical Digest 2005, p. 709.

* cited by examiner (a)

(b)

SEMICONDUCTOR DEVICE AND METHOD FOR MANUFACTURING THE SAME

TECHNICAL FIELD

The present invention relates to a semiconductor device including a full-silicide gate electrode and a method for manufacturing the semiconductor device and, more particularly, to a technique for enhancements in the performance and reliability of a MOS-type field-effect transistor (MOSFET: Metal Oxide Semiconductor Field-effect Transistor).

BACKGROUND ART

In the development of an advanced CMOS (complementary MOS) device where transistors have been increasingly miniaturized, the degradation of drive currents due to the depletion of a polysilicon (poly-Si) electrode has become an issue. Hence, a study is being made of a technique to prevent drive current degradation by applying a metal gate electrode and thereby avoiding electrode depletion.

As a material to be used for the metal gate electrode, pure metals, metal nitrides, silicide materials and the like are under study. In any case of these materials, however, the threshold voltages (Vth) of an N-channel MOSFET (hereinafter referred to as the "nMOS") and a P-channel MOSFET (hereinafter referred to as the "pMOS") must be settable to correct values.

In the case of a high-performance CMOS transistor, the Vth needs to be set to approximately ±0.1 eV. Accordingly, a material having a work function not higher than the work function (4.0 eV) of n-type polysilicon needs to be used for the gate electrode of the nMOS. In addition, a material having a work function not lower than the work function (5.2 eV) of p-type polysilicon needs to be used for the gate electrode of the pMOS.

As means for realizing these objectives, there has been proposed a method for controlling the Vth of a transistor by selectively using dissimilar metals or alloys having different work functions for the gate electrodes of the nMOS and the pMOS (dual-metal gate technology).

For example, non-patent document 1 (International Electron Devices Meeting Technical Digest 2002, p. 359) describes that the work functions of Ta and Ru formed on $SiO_2$ are 4.15 eV and 4.95 eV, respectively, and therefore a work function modulation of 0.8 eV is possible between these two electrodes.

On the other hand, a technique related to a full-silicide electrode in which a polysilicon electrode is completely silicided with Ni, Hf, W or the like has been a focus of attention recently.

For example, patent document 1 (US 2005/0070062-A) discloses that the consistency of a formation process with a conventional CMOS process is increased by using $SiO_2$ for a gate insulating film and by using a silicide electrode obtained by completely siliciding polysilicon implanted with an impurity, such as P or B, as a gate electrode, and discloses that threshold voltage can be controlled by doping an impurity into yet-to-be-silicided polysilicon on $SiO_2$.

For this reason, the full-silicide electrode is considered to be a promising metal gate. In threshold control based on doping in particular, effective work functions of approximately 4.2 to 4.4 eV and 4.7 to 4.9 eV have been obtained for the nMOS and pMOS, respectively, when impurities (B, Al, Ga, In or TI for the pMOS and N, P, As, Sb or Bi for the nMOS) used in a conventional semiconductor process are used. Such a threshold change as described above is caused as a result of the above-described doped impurities being segregated on a silicide electrode/$SiO_2$ gate insulating film boundary at the time of silicidation due to a so-called "snow-plow" effect. Doping-based threshold control enables the selective fabrication of the pMOS and nMOS and is, therefore, considered promising as a method for controlling the threshold of a transistor using $SiO_2$ as the gate insulating film thereof.

In addition, in the technique described in patent document 2 (JP 2005-129551-A), effective work functions of approximately 4.1 eV and 5.1 eV have been obtained, respectively, for the nMOS when the Ni composition of the gate electrode thereof is 30 to 60% and contains an n-type impurity and for the pMOS when the Ni composition of the gate electrode thereof is 40 to 70% and contains a p-type impurity.

However, the above-described techniques respectively have had the below-described problems.

The dual-metal gate technology to selectively fabricate dissimilar metals or alloys having different work functions, requires a process of etching away a metal layer deposited on either one of the gate insulating films of the pMOS and nMOS. The process deteriorates the quality of the gate insulating film at the time of the etching, thus causing the characteristics and reliability of elements to degrade.

In a case where an NiSi electrode (nickel monosilicide electrode) obtained by completely siliciding a polysilicon electrode implanted with an impurity, such as P or B, is applied as a gate electrode on an $SiO_2$ gate insulating film, the effective work functions obtained for the nMOS and pMOS are approximately 4.2 to 4.4 eV and 4.7 to 4.9 eV, respectively, as described above. In order to materialize a high-performance transistor, however, it is necessary to realize even lower thresholds by controlling the effective work functions.

In patent document 2, effective work functions of approximately 4.1 eV and 5.1 eV have been obtained, respectively, for the nMOS when the Ni composition of the gate electrode thereof is 30 to 60% and contains an n-type impurity and for the pMOS when the Ni composition of the gate electrode thereof is 40 to 60% and contains a p-type impurity. However, there has not been found out any Ni silicide electrode having effective work functions (4.0 eV for the nMOS and 5.2 eV for the PMOS) wherewith thresholds required of a high-performance nMOS and pMOS can be realized in these composition ranges.

If the Ni composition of the gate electrode is 40% or higher, the adhesion of the gate electrode to the $SiO_2$ gate insulating film is extremely low. Therefore, separation is liable to take place in a gate electrode/insulating film boundary. As a result, element performance is likely to degrade. In addition, it is known that if the Ni composition of the gate electrode is 40% or higher, an electrode-induced compressive stress is applied to the gate insulating film, thus degrading the reliability of the gate insulating film (International Electron Devices Meeting Technical Digest 2005, p. 709). From the above-described points of view, it is preferable that the Ni composition of the gate electrode is lower than 40%. However, there has not been found out any Ni silicide electrode wherewith a threshold required of a high-performance pMOS can be realized in this composition range.

When fabricating a CMOS device, it is preferable that the silicide electrodes of both the nMOS and pMOS can be formed in one step of silicidation, in order to reduce costs through simplified steps. To that end, the compositions of the Ni full-silicide electrodes of the nMOS and pMOS need to be the same. However, there have not been found out any Ni silicide electrodes having effective work functions (4.0 eV for the nMOS and 5.2 eV for the pMOS) wherewith thresholds required of a high-performance CMOS device can be realized, whereas silicides composing the nMOS and pMOS gate electrodes are the same in composition.

Along with the miniaturization of elements, there has also been a requirement for controlling a variation in the threshold of a transistor.

In order to form a gate electrode composed of an $NiSi_2$ crystal phase, temperature at the time of heat treatment for silicidation needs to be set higher than 600° C. or 650° C. However, if low-resistance NiSi (nickel monosilicide) is formed in the contact region of a source/drain region, there is the problem that an increase in the resistance value of NiSi is caused by the heat treatment.

DISCLOSURE OF THE INVENTION

An object of the present invention is to provide a high-performance semiconductor device superior in reliability and a method for manufacturing the semiconductor device.

There are provided the following semiconductor devices and methods for manufacturing the semiconductor devices in embodiments in accordance with the present invention.

(1) A semiconductor device including:

a silicon substrate;

an N-channel field-effect transistor including a first gate insulating film on the silicon substrate, a first gate electrode on the first gate insulating film, and a first source/drain region; and a P-channel field-effect transistor including a second gate insulating film on the silicon substrate, a second gate electrode on the second gate insulating film, and a second source/drain region;

wherein each of the first and second gate electrodes includes:

a crystallized nickel silicide region containing an impurity element, the crystallized nickel silicide region being contact with said first or second gate insulating film; and a barrier layer region in an upper portion including an upper surface of the gate electrode, the barrier layer region containing an Ni diffusion-preventing element higher in concentration than that of a lower portion below the upper portion.

(2) The semiconductor device according to item (1), wherein the Ni diffusion-preventing element is at least either one of a nitrogen atom and an oxygen atom.

(3) The semiconductor device according to item (1) or (2), wherein the concentration of the Ni diffusion-preventing element of the barrier layer region is 0.1 to 10 atom %.

(4) The semiconductor device according to any one of items (1) to (3), wherein the thickness of the barrier layer region in a direction perpendicular to the substrate is 1 to 10 nm.

(5) The semiconductor device according to any one of items (1) to (4), wherein the crystallized nickel silicide region of the first gate electrode contains an n-type impurity, and the second crystallized nickel silicide region of the second gate electrode contains a p-type impurity and has the same nickel silicide composition as the crystallized nickel silicide region of the first gate electrode.

(6) The semiconductor device according to any one of items (1) to (5), wherein a silicide composing each of the crystallized nickel suicide regions has a composition represented as $Ni_xSi_{1-x}$ ($0.2 \leqq x < 0.4$).

(7) The semiconductor device according to any one of items (1) to (5), wherein a silicide composing each of the crystallized nickel silicide regions includes an $NiSi_2$ crystal phase.

(8) The semiconductor device according to any one of items (1) to (7), wherein the first gate electrode includes, in a portion contact with the first gate insulating film, a region containing an n-type impurity higher in concentration than that of an upper portion above the region and the second gate electrode includes, in a portion contact with the second gate insulating film, a region containing a p-type impurity higher in concentration than that of an upper portion above the region.

(9) The semiconductor device according to any one of items (1) to (8), wherein the first gate electrode includes, in a portion contact with the first gate insulating film, a region having an n-type impurity concentration of $1\times10^{20}$ $cm^{-3}$ or higher and the second gate electrode includes, in a portion contact with the second gate insulating film, a region having an p-type impurity concentration of $1\times10^{20}$ $cm^{-3}$ or higher.

(10) The semiconductor device according to any one of items (1) to (9), wherein each of the first and second gate insulating films includes either one of a silicon dioxide film, a silicon oxynitride film and a silicon nitride film, the film being contact with the first or second gate electrode.

(11) A method for manufacturing a semiconductor device as recited in item (1), including:

preparing a silicon substrate including a p-type active region and an n-type active region;

forming an insulating film for first and second gate insulating films on the silicon substrate;

forming a silicon film for gate electrodes on the insulating film;

doping an n-type impurity into the silicon film gate electrodes in a region where an N-channel field-effect transistor is to be formed;

doping a p-type impurity into the silicon film for gate electrodes in a region where a P-channel field-effect transistor is to be formed;

processing the gate silicon film for gate electrodes to form a gate pattern;

forming a first source/drain region in a region where the N-channel field-effect transistor is to be formed;

forming a second source/drain region in a region where the P-channel field-effect transistor is to be formed;

forming an interlayer insulating film over the gate pattern;

removing an upper-layer portion of the interlayer insulating film such that the gate pattern is exposed;

forming a nickel film on the exposed gate pattern;

irradiating an Ni diffusion-preventing element to an entire surface of the nickel film;

forming first and second gate electrodes by performing a heat treatment and thereby siliciding the gate pattern; and removing an unsilicided excess nickel of the nickel film.

(12) The method for manufacturing a semiconductor device according to item (11), wherein the Ni diffusion-preventing element is at least either one of a nitrogen atom and an oxygen atom.

(13) The method for manufacturing a semiconductor device according to item (11) or (12), wherein the irradiation of the Ni diffusion-preventing element is performed using a plasma irradiation method or an ion implantation method.

In the present specification, the "effective work function" of a gate electrode is generally determined from a flat band voltage based on CV measurement. The effective work function is affected by fixed charge within an insulating film, dipoles formed in a boundary, Fermi-level pinning and the like, in addition to the gate electrode's intrinsic work function. The effective work function is distinguished from the intrinsic "work function" of a material composing the gate electrode.

Also in the present specification, "MOS" (Metal Oxide Semiconductor) refers to a laminated structure including an electrical conductor, an insulator and a semiconductor, wherein the electrical conductor is not limited to an elementary substance of metal and the insulator is not limited to silicon dioxide.

According to the present invention, it is possible to provide a high-performance semiconductor device superior in reliability and a simplified method for manufacturing the semiconductor device.

BEST MODE FOR CARRYING OUT THE INVENTION

Hereinafter, the present invention will be described in detail according to the exemplary embodiments thereof.

Figure 1:
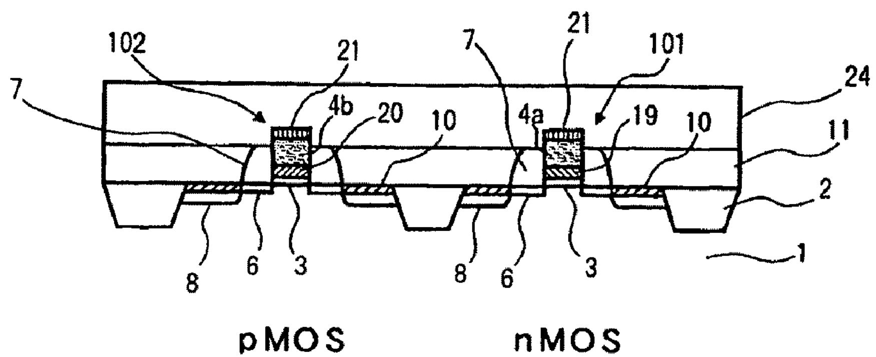
FIG. 1 is a schematic cross-sectional view illustrating a semiconductor device in accordance with one exemplary embodiment of the present invention.

FIG. 1 illustrates a CMOS structure in accordance with one exemplary embodiment of the present invention. In FIG. 1, reference numeral 1 denotes a silicon substrate, reference numeral 2 denotes an element-isolating region, reference numeral 3 denotes a gate insulating film, reference numerals 4*a* and 4*b* denote impurity-doped silicide layers, reference numeral 6 denotes an extended diffusion region, reference numeral 7 denotes a gate sidewall, reference numeral 8 denotes a source/drain diffusion region, reference numeral 10 denotes a silicide layer, reference numerals 11 and 24 denote interlayer insulating films, reference numerals 19 and 20 denote impurity-segregated regions, reference numeral 21 denotes a barrier layer region, and reference numerals 101 and 102 denote gate electrodes.

In this CMOS structure, the base materials of both the gate electrode 102 of a pMOS and the gate electrode 101 of an nMOS are formed of an $NiSi_2$ crystal phase. In the gate electrode 102 of the pMOS, a p-type impurity is doped into the base material formed of the $NiSi_2$ crystal phase. In the gate electrode 101 of the nMOS, an n-type impurity is doped into the base material formed of the $NiSi_2$ crystal phase. The gate electrode 102 of the pMOS includes the p-type impurity-segregated region 20 in the vicinity of a boundary with the gate insulating film and the barrier layer region 21 in the upper portion of the gate electrode 102. The gate electrode 101 of the nMOS includes the n-type impurity-segregated region 19 in the vicinity of a boundary with the gate insulating film and the barrier layer region 21 in the upper portion of the gate electrode 101.

According to such a CMOS structure as described above, it is possible to not only avoid gate electrode depletion but also fabricate a high-performance device having high reliability and a desired threshold with excellent reproducibility.

The present invention has been attained by newly finding out the below-described facts and on the basis thereof.

If a gate electrode made of a high-crystal quality impurity-doped Ni full-silicide is formed on a gate insulating film having a silicon dioxide film or a silicon oxynitride film as the outermost surface thereof, a change in the effective work function of the gate electrode due to doping (a difference between cases where an impurity is doped and not doped) increases as the Ni composition of the silicide decreases. Thus, it is possible to realize an effective work function even more appropriate for threshold control, compared with effective work functions based on the related art. In particular, if a crystallized Ni silicide having an Ni composition lower than 40% and doped with an impurity element is used as the gate electrode, it is possible to materialize a pMOS and an nMOS having thresholds lower than those of a pMOS and an nMOS based on the related art.

The above-described facts have been able to be found out from the below-described exploratory experiment performed using a MOS capacitor.

First, an $SiO_2$ gate insulating film (film thickness: 3 nm) was formed on a silicon substrate and an 80 nm-thick polysilicon film was formed thereon.

Next, an impurity was ion-implanted into this polysilicon film. In order to realize an nMOS, N, P, As, Sb, Bi or the like, which is an n-type impurity, may be ion-implanted into Si. In order to realize a pMOS, B, Al, In, Ga, TI or the like, which is a p-type impurity, may be ion-implanted into Si.

After that, an Ni film (film thickness: $T_{Ni}$) was deposited on the polysilicon film (film thickness: $T_{Si}$). Then, a heat treatment was performed to fully silicide the polysilicon film.

Table 1 shows a relationship between the film thickness ratio of the Ni film to the polysilicon film (Si film) before silicidation and the type of crystal phase of a nickel silicide formed by silicidation.

TABLE 1

| | | Ni/Si Film Thickness Ratio | | |
|---|---|---|---|---|
| | | 0.28-0.54 | 0.55-0.95 | 1.6 or higher |
| Anneal Temperature | 650° C. | $NiSi_2$ (+NiSi) | | |
| | 600° C. | NiSi | | |
| | 500° C. | NiSi | NiSi | $Ni_3Si$ (+NiSi) |
| | 450° C. | | NiSi | $Ni_3Si$ (+NiSi) |
| | 400° C. | | NiSi | $Ni_3Si$ (+NiSi) |

As shown in Table 1, the crystal phase of the Ni silicide is determined in a stepwise manner with respect to the thickness of the Ni film deposited on the polysilicon film, i.e., the amount of Ni supplied to polysilicon. For example, if the crystal phase of the Ni silicide in the vicinity of a gate electrode/insulating film boundary influential on the effective work function needs to be formed mainly as an NiSi phase, the ratio ($T_{Ni}/T_{Si}$) of an Ni film thickness ($T_{Ni}$) to a polysilicon film thickness ($T_{Si}$) may be set within the range of 0.55 to 0.95. Likewise, if the crystal phase needs to be formed mainly as an $Ni_3Si$ phase, the $T_{Ni}/T_{Si}$ ratio may be set to 1.6 or higher. In order to form the crystal phase of the Ni silicide in the vicinity of the gate electrode/insulating film boundary into a silicide including primarily an $NiSi_2$, the $T_{Ni}/T_{Si}$ ratio needs to be set within the range of 0.28 to 0.54, and the silicidation temperature needs to be set to 600° C. or higher, preferably 650° C. or higher. The composition ratio (Ni/[Ni+Si]) that defines the work function of the Ni silicide is determined almost in a self-aligned manner as a result of formation of a crystal phase of $NiSi_2$, NiSi, $Ni_3Si$ or the like. Therefore, the margin of process conditions, such as the Ni film thickness and the silicidation temperature, under which the same crystal phase (i.e., the same work function) can be obtained, is wide. Thus, it is possible to suppress manufacturing process-induced variations.

At the time this full silicidation, the impurity was segregated in the vicinity of a silicide electrode/insulating film boundary due to a "snowplow" effect. At that time, the effective work function hardly changed if the concentration of the segregated impurity in the vicinity of the boundary was below $1\times10^{20}$ $cm^{-3}$. Accordingly, in order to change the effective work function, it is preferable that a portion of the gate electrode near the gate electrode/gate insulating film boundary includes an impurity-segregated region containing an impurity higher in concentration than the impurity of the upper portion of the gate electrode. More preferably, the impurity concentration of the impurity-segregated region is $1\times10^{20}$ $cm^{-3}$ or higher. From the viewpoint of element reliability, this impurity concentration is preferably $1\times10^{23}$ $cm^{-3}$ or lower and, more preferably, $5\times10^{22}$ $cm^{-3}$ or lower. That is, the gate electrode of the present invention preferably contains, in the portion thereof in contact with the gate insulating film, an impurity the concentration of which is within the above-described range. In addition, the impurity region (impurity-segregated region) of the gate electrode having the above-described concentration range preferably exists over a distance of 5 nm or longer from the gate electrode/insulating film boundary along the thickness direction of the impurity region (direction perpendicular to a substrate plane).

The crystal phase of the Ni silicide of the MOS capacitor fabricated as described above was identified using an XRD. As shown in Table 1, if $T_{Ni}/T_{Si}$=0.28 to 0.54, then an Ni silicide to be formed is composed substantially of $NiSi_2$. However, an XRD observation shows that $NiSi_2$ has a low peak intensity while a peak of NiSi is seen. According to an XPS-based analysis of a silicide electrode composition in the depth direction thereof, the silicide electrode has a part on the upper surface side thereof where an Ni composition is slightly higher, compared with that of $NiSi_2$. Conceivably, NiSi exists mainly in that part. If $T_{Ni}/T_{Si}$=0.55 to 0.95, then an Ni silicide to be formed is composed substantially of NiSi. In addition, if $T_{Ni}/T_{Si}$ is 1.6 or higher, then an Ni silicide to be formed is composed substantially of $Ni_3Si$.

Figure 2:
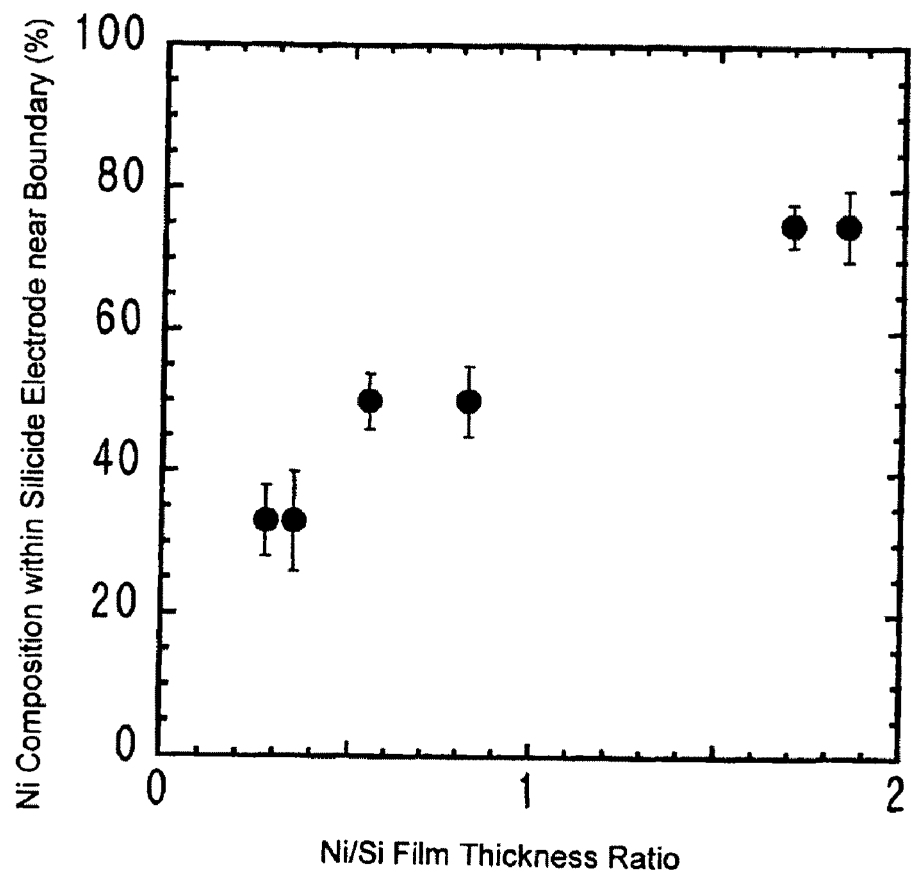
FIG. 2 is a graphical view showing a relationship between the composition of a crystallized Ni silicide and a film thickness ratio of Ni to polysilicon before silicidation (Ni film thickness/Si film thickness)

FIG. 2 shows a relationship between the Ni composition within the electrode in the vicinity of the electrode/insulating film boundary of the MOS capacitor fabricated as described above and the Ni film thickness/polysilicon film thickness (Si film thickness) ratio ($T_{Ni}/T_{Si}$) thereof before silicidation. The Ni composition within the electrode was determined from XPS measurement. An error bar in the electrode composition represents a variation in XPS-based multipoint measurement.

From this figure, it is understood that the Ni composition within the electrode in the vicinity of the boundary is determined in a stepwise manner according to the $T_{Ni}/T_{Si}$ ratio. For example, if $T_{Ni}/T_{Si}$=0.28 to 0.54, 0.55 to 0.95, and 1.6 or higher, then the Ni compositions within the electrode were 33.3±7%, 50±5%, and 75±5%, respectively. These compositions respectively agreed substantially with the Ni composition (33.3%) of $NiSi_2$, the Ni composition (50%) of NiSi, and the Ni composition (75%) of $Ni_3Si$. The reason for this is probably that as can be seen in Table 1, the Ni composition within the electrode in the vicinity of the boundary is determined in a self-aligned manner as a result of crystal phase formation.

Figure 3:
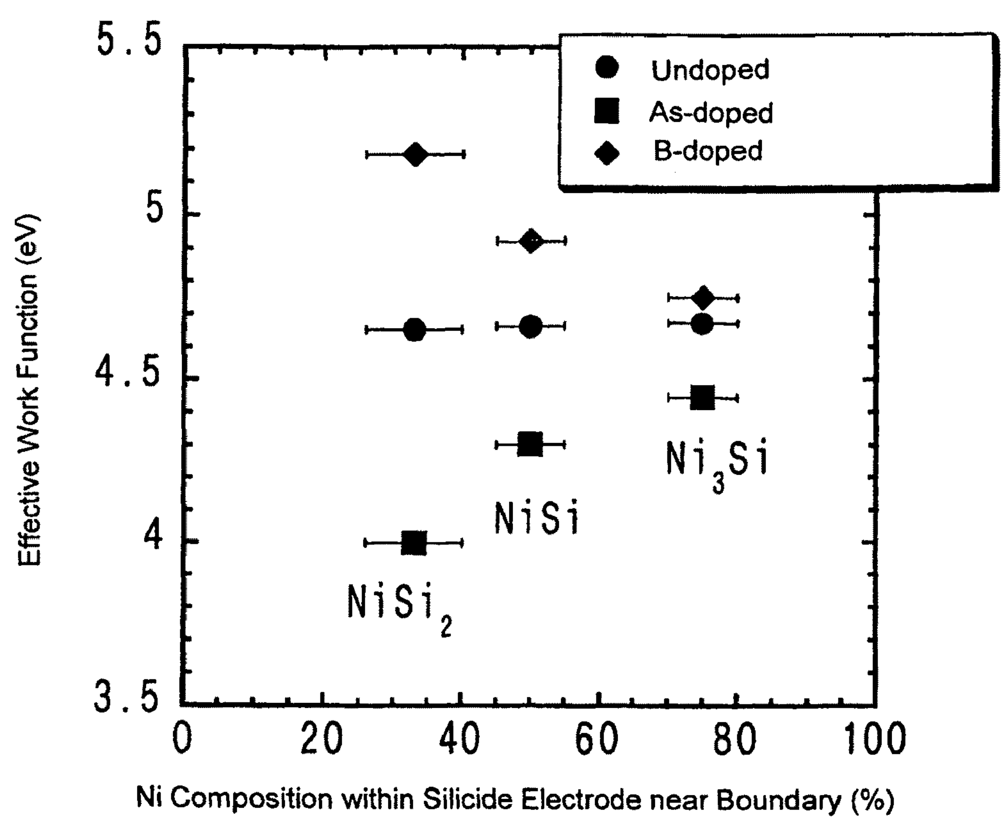
FIG. 3 is a graphical view showing a relationship among the effective work function of the crystallized Ni silicide, an Ni composition and the effect of doping.

FIG. 3 shows a relationship between the effective work function of a crystallized Ni silicide and the composition of a silicide electrode in the vicinity of a boundary, with respect to a MOS capacitor fabricated as described above, when an impurity was not doped (undoped), when As was doped and when B was doped (both the amounts of As and B doped into polysilicon were $5\times10^{20}$ $cm^{-3}$). An error bar in the electrode composition represents a variation in XPS-based multipoint measurement. In addition, a primary crystal phase in the composition in question is shown in the figure.

As can be understood from this figure, the effective work function of the crystallized Ni silicide hardly depends on the composition thereof when an impurity is not doped. Consequently, a threshold variation is suppressed even if the Ni composition varies as much as ±5%.

When attention is paid to a case where an impurity is doped, it is understood that as the Ni composition decreases (Si composition increases), a change in the effective work function due to doping (difference between cases where an impurity is doped and not doped) increases. In particular, the effective work functions are 4.0 eV for As doping and 5.2 eV for B doping in a domain of the Ni composition of 26 atom % to 40 atom % where the primary crystal phase is $NiSi_2$. Thus, it is possible to realize effective work functions (4.0 eV or lower for an nMOS and 5.2 eV or higher for a pMOS) required of a high-performance CMOSFET device.

The tendency that a change in the effective work function due to doping increased with the decrease of the Ni composition in the Ni silicide (increase of the Si composition) was confirmed for every impurity having the effect of modulating work functions. In addition, effective work functions in crystallized $NiSi_2$ in particular were 4.0 eV or lower in the case of an n-type impurity (N, P, As, Sb, Bi and the like) and 5.2 eV or higher in the case of a p-type impurity (B, Al, In, Ga, TI and the like). It was thus confirmed that it was possible to realize effective work functions (4.0 eV or lower for the nMOS and 5.2 eV or higher for the pMOS) required of a high-performance CMOS device.

The dependence of a change in the effective work function due to such doping as described above upon the Ni composition within the electrode completely differs from the tendency disclosed in JP2005-129551-A. In particular, the dependence of the effective work function upon the Ni composition within the electrode is reversed between the present exemplary embodiment and the embodiments described in this publication when a p-type impurity is doped.

This is for the reason described hereinafter. In the case of JP2005-129551-A, a change in the effective work function (difference between cases where an impurity is doped and not doped) due to doping depends only on the type and amount of impurity and hardly depends on the composition of an Ni full-silicide electrode which is a main body. In addition, the effective work function of an undoped Ni full-silicide electrode increases (from 4.43 eV to 5.1 eV) as the Ni composition increases (from 30 atom % to 100 atom %). In contrast, in the case of the present exemplary embodiment, the effective work function of the undoped crystallized Ni silicide hardly depends on the Ni composition and a change in the effective work function due to doping increases as the Ni composition decreases (the Si composition increases), as shown in FIG. 3. In this way, the present exemplary embodiment and the embodiments described in the above-described publication significantly differ from each other in the dependence of a change in the effective work function due to doping upon the electrode composition. This difference is probably attributable to a difference in crystal quality due to a difference in a formation method, as will be described later in comparative examples.

As shown in FIG. 3, the effective work function of an impurity-doped Ni silicide is affected by the Ni composition. It is therefore preferable to form a silicide the Ni composition of which is determined in a self-aligned manner. That is, it is preferable to form a silicide composed of a thermodynamically stable crystal phase as the primary crystal phase thereof. It is particularly preferable to form a silicide composed of an $NiSi_2$ crystal phase as the primary crystal phase thereof. As described above, the Ni composition is determined in a self-aligned manner as a result of formation of an $NiSi_2$ crystal phase and, therefore, the margin of process conditions is wide. Thus, it is possible to suppress manufacturing process-induced variations in the Ni composition. That is, according to the present invention in which doped crystallized $NiSi_2$ is applied to the gate electrode, the electrode composition is determined in a self-aligned manner at the time of full silicidation. It is therefore possible to form a transistor in which a threshold variation is suppressed. In addition, the adhesion of a silicide electrode to a gate insulating film is improved since it is possible to form a silicide the Ni composition of which is lower than 40 atom %. It is also possible to suppress a gate electrode-induced compressive stress on the gate insulating film, thereby forming a high-reliability transistor.

Figure 4:
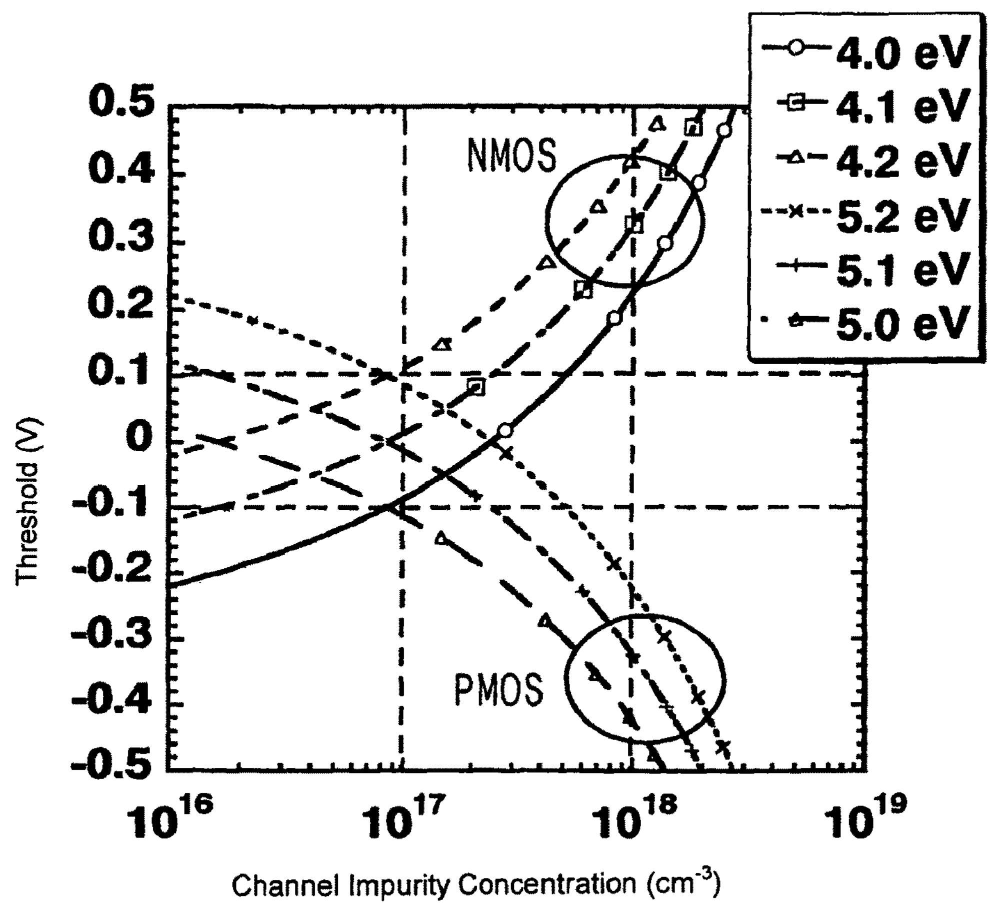
FIG. 4 is a graphical view used to explain the threshold range of a transistor that can be realized using the work function of a silicide electrode fabricated according to the present invention.

If an oxide film thickness is 1.8 nm, the range of thresholds (Vth) of an MOSFET predictable from an effective work function is represented as shown in FIG. 4, with respect to a channel impurity concentration. In an embodiment according to the present invention that uses a crystallized Ni silicide electrode in which an effective work function can be modulated to 4.0 eV or lower for an nMOS, or 5.2 eV or higher for a pMOS, by doping an impurity, it is possible to realize a high-performance device having a threshold as low as approximately 0.1 V, which has not been available by the use of a conventional impurity-doped NiSi electrode, at the channel concentration ($10^{17}$ to $10^{18}$ $cm^{-3}$) of a regular CMOS device.

The Ni composition of the crystallized Ni silicide composing the gate electrode in the present invention is preferably lower than 40 atom %. For Ni compositions lower than 40 atom %, the gate electrode has excellent adhesion to a gate insulating film, such as a silicon dioxide film ($SiO_2$ film) or a silicon oxynitride film (SiON film). In addition, any electrode-induced stress hardly occurs and, therefore, it is possible to realize an increased reliability of a MOSFET.

In the present invention, the Ni composition of the crystallized Ni silicide composing the gate electrode is preferably 5 atom % or higher and, more preferably, 10 atom % or higher, from the viewpoint of gate depletion control and gate resistance reduction. Furthermore, from the viewpoint of threshold control, the Ni composition is preferably 20 atom % or higher, more preferably 25 atom % or higher, and particularly preferably 30 atom % or higher. In consideration of threshold control in addition to the above-described increased reliability, the Ni composition is preferably 38 atom % or lower, and more preferably 35 atom % or lower. Note that the Ni composition is represented by the ratio of the amount of Ni to the sum of the amounts of Ni and Si (Ni/[Ni+Si]) expressed in percentage on the basis of the number of atoms. That is, from the viewpoint of gate depletion prevention, gate resistance reduction and reliability improvement, an Ni silicide expressed as $Ni_xSi_{1-x}$ ($0.1 \leqq x \leqq 0.4$) is preferred. In consideration of threshold control in addition to these points of view, an Ni silicide expressed as $Ni_xSi_{1-x}$ ($0.2 \leqq x \leqq 0.4$) is more preferred. Furthermore, from these points of view, "x" in these expressions is preferably within the above-described preferred ranges of Ni compositions.

From the viewpoint of obtaining desired effective work functions, the region of a crystallized silicide having one of the above-described Ni compositions in the gate electrode of the present invention preferably exists over a distance of 5 nm or longer, and more preferably 10 nm or longer, from a gate electrode/gate insulating film boundary along the thickness direction of the region (direction perpendicular to a substrate plane).

Since the present invention uses crystallized Ni silicide electrodes doped with the above-described impurities for the gate electrodes thereof, it is possible to form Ni silicide electrodes in one step of silicidation for both an nMOS and a pMOS, as will be described later, when fabricating a CMOS device. Consequently, it is possible to reduce the number of steps and to simplify processes, and thus cost reductions can be achieved.

As a gate insulating film in the present invention, a silicon dioxide film or a silicon oxynitride film can be used. Alternatively, a high-dielectric insulating film, such as an HfSiON film, may be used as the gate insulating film. In this case, the span of threshold change due to doping becomes smaller, compared with a case in which a silicon dioxide film or a silicon oxynitride film is used. It is possible to increase a change in the effective work function, however, by interposing a silicon dioxide film, a silicon oxynitride film or a silicon nitride film in a portion in contact with the gate electrode. As a result, it is possible to realize a low threshold in a MOSFET. A silicon dioxide film or a silicon oxynitride film may be provided between the high-dielectric insulating film and the silicon substrate.

Note that the term "high-dielectric (high-k) insulating film" is used herein in the sense of distinguishing this insulating film from an insulating film made of silicon dioxide ($SiO_2$) that has been used conventionally and commonly as a gate insulating film. Accordingly, the term only means that the high-dielectric insulating film is higher in dielectric constant than the silicon dioxide and does not define any specific value of the dielectric constant.

In addition to the above-described findings, the semiconductor device according to the present invention includes the below-described configurational features.

That is, the silicide gate electrode includes a barrier layer region containing a Ni diffusion-preventing element in an upper portion of the silicide gate electrode, the upper portion including the upper surface of the gate electrode. As a result of this barrier layer region being included, the outward diffusion of Ni and an impurity from the gate electrode into a contact interconnect is suppressed. Consequently, it is possible to suppress threshold voltage variations. As a channel portion and a contact portion come closer to each other due to the densification of a semiconductor device or the gate size (height in particular) becomes smaller due to miniaturization, a compositional change due to the outward diffusion of Ni or an impurity becomes more liable to affect the threshold voltage. The present invention is particularly advantageous in such a densified and miniaturized semiconductor device as described above.

Examples of the Ni diffusion-preventing element include a nitrogen atom (N) and an oxygen atom (O), and either one or both of these elements can be used. Of these elements, the nitrogen atom is preferred from the viewpoint of the Ni diffusion-preventing effect and of element manufacture.

The thickness of this barrier layer region (length in a direction perpendicular to the substrate) is preferably 1 nm or longer, and more preferably 3 nm or longer, from the viewpoint of obtaining a sufficient effect of forming the barrier layer region. In addition, the length is preferably 10 nm or shorter, and more preferably 8 nm or shorter, from the viewpoint of conductive property and manufacturing costs. The concentration of the Ni diffusion-preventing element of this barrier layer region is preferably within the range of 0.1 to 10 atom %, more preferably 1 to 10 atom %, and even more preferably 1 to 8 atom %. From the viewpoint of the effect of forming the barrier layer region, conductive property and manufacturing costs, the concentration is preferably within this range.

The silicide composing the gate electrode below this barrier layer region is preferably an $NiSi_2$ crystal phase, as describe above, from the viewpoint of lowering the threshold.

The present invention is suitable for a microfabricated semiconductor device having a gate electrode height (length in a direction perpendicular to the substrate) of 200 nm or less, more suitably 150 nm or less, and particularly suitably 100 nm or less. From the viewpoint of ensuring operation performance and of manufacturing precision, however, the height of the gate electrode is preferably 30 nm or greater, and more preferably 40 nm or greater. In addition, the gate length can be set within the range of, for example, 10 to 100 nm.

The semiconductor device described hereinabove can be fabricated using a manufacturing method having the below-described characteristic features.

The main characteristic feature of the manufacturing method according to the present invention is that, in a step of forming an Ni silicide gate electrode by forming an Ni film on a gate electrode pattern made of a gate silicon material and performing a heat treatment for silicidation, an Ni diffusion-preventing element is irradiated to the Ni film, and then the heat treatment for silicidation is performed.

The Ni diffusion-preventing element irradiated to a surface of the Ni film forms into a barrier layer region during the heat treatment. Thus, it is possible to prevent the diffusion of Ni atoms from the Ni film into gate silicon and a formed silicide. The supply rate of Ni atoms is controlled by adjusting this diffusion-preventing effect by the amount of irradiation (for example, irradiation time) of the Ni diffusion-preventing element. Accordingly, the rate of silicide formation is controlled as well. By such a diffusion-preventing effect as described above, it is possible to lower the Ni composition (raise the Si composition) within a relatively low silicidation temperature range (range from 350 to 500° C.). As a result, it is possible to form an $NiSi_2$ crystal phase wherewith a low threshold can be realized at a relatively low silicidation temperature. Therefore, at the time of siliciding to form the crystal phase, it is possible to suppress an increase in the resistance value of a metal silicide, such as an Ni monosilicide, formed in the contact region of a source/drain diffusion region.

Figure 14:
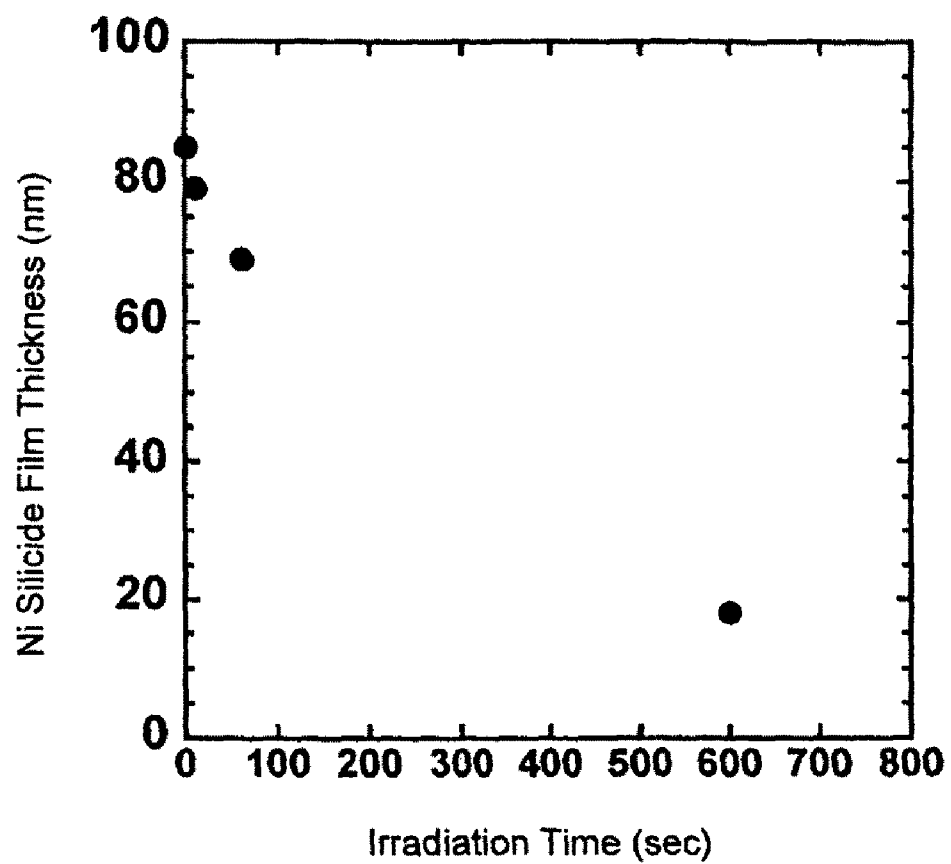
FIG. 14 is a graphical view showing a change in the thickness of a silicide region with respect to the time of nitrogen plasma irradiation.
Figure 15:
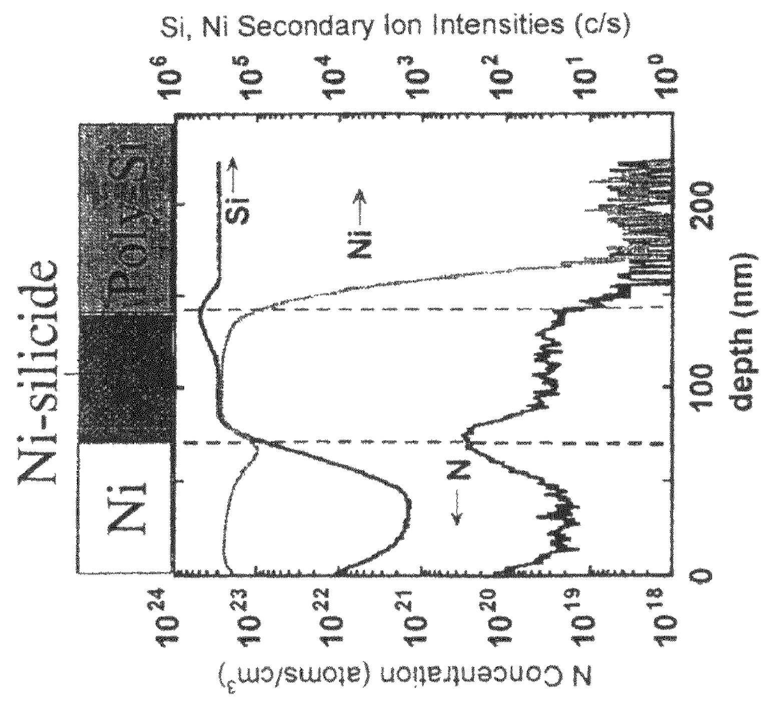
FIG. 15 is a graphical view showing composition distributions in the thickness direction (depth direction) of the silicide region based on silicidation (FIG. 15(*a*) shows a composition distribution when nitrogen plasma irradiation is not performed, whereas FIG. 15(*b*) shows a composition distribution when nitrogen plasma irradiation is performed)
Figure 15:
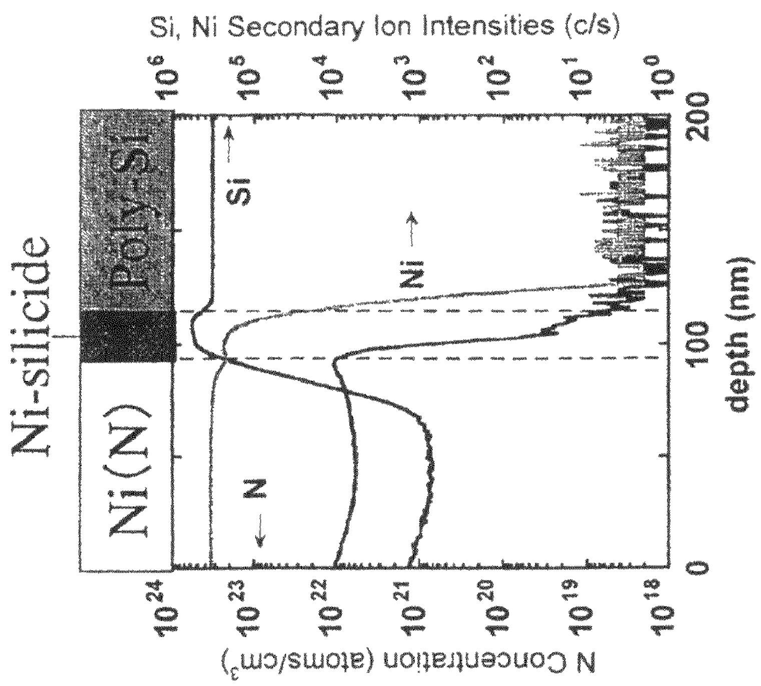

FIGS. 14 and 15 show the result of measurement when silicidation is performed using a nitrogen atom (N) as the Ni diffusion-preventing element. FIG. 14 shows a change in the thickness of a silicide film (length in a direction perpendicular to the substrate) with the time of nitrogen plasma irradiation. FIG. 15 shows a composition distribution in the depth direction of the silicide film (direction perpendicular to the substrate) due to silicidation, wherein FIG. 15(*a*) shows a case where nitrogen plasma irradiation was not performed and FIG. 15(*b*) shows a case where nitrogen plasma irradiation was performed (irradiation time: 10 minutes). The measurement of the composition distribution was performed by means of SIMS (Secondary Ion Mass Spectrometry) analysis. Silicidation was performed as described hereinafter. That is, a silicon dioxide film (90 nm-thick), a polysilicon (poly-Si) film (150 nm-thick) and an Ni film (90 nm-thick) were formed on a silicon substrate in this order. Next, nitrogen plasma irradiation was performed on the Ni film at an RF power of 400 W, for 10 seconds to 10 minutes, under a nitrogen atmosphere (0.8 Pa nitrogen pressure). Next, a heat treatment was performed at 280° C. for 18 minutes and 20 seconds.

As is evident from FIG. 14, it is possible to control the thickness of the silicide film by the time of nitrogen plasma irradiation. In addition, this result shows that it is possible to control the amount of diffusion of nickel atoms from the Ni region into the silicide region and the polysilicon region.

From FIGS. 15(*a*) and 15(*b*), it is understood that when nitrogen plasma irradiation is performed, a nitrided region containing a higher-concentration nitrogen, compared with a case when nitrogen plasma irradiation is not performed, exists in a silicide region in the vicinity of a boundary (corresponds to the upper surface of the gate electrode) between the Ni region and the silicide region. This nitrided region probably functions as a barrier layer region and prevents the diffusion of nickel atoms from the Ni region into the silicide region and the polysilicon region.

In the present invention, it is possible to control the work functions of pMOS and nMOS gate electrodes by the composition of the silicide composing the gate electrodes and by the impurity contained in the silicide, as described above. That is, crystallized silicides of the same composition may be formed in the pMOS and nMOS regions as gate materials and the silicides in the pMOS and nMOS regions may contain different impurities. Consequently, in the manufacturing method of the present invention, it is possible to form gate electrodes having work functions different between the pMOS and nMOS after forming the gate materials on the gate insulating film, without having to carry out a step of removing the gate materials. Accordingly, the surface of the gate insulating film is not exposed to a wet etching liquid or an organic solvent and, therefore, the quality of the gate insulating film is not impaired. As a result, it is possible to fabricate a CMOS device superior in reliability. In addition, since doping into the gate materials can be performed precisely using an already-established technique, such as ion implantation, it is possible to suppress threshold variations.

Hereinafter, the present invention will be described further with reference to examples of manufacture.

Example of Manufacture 1

Figure 5:
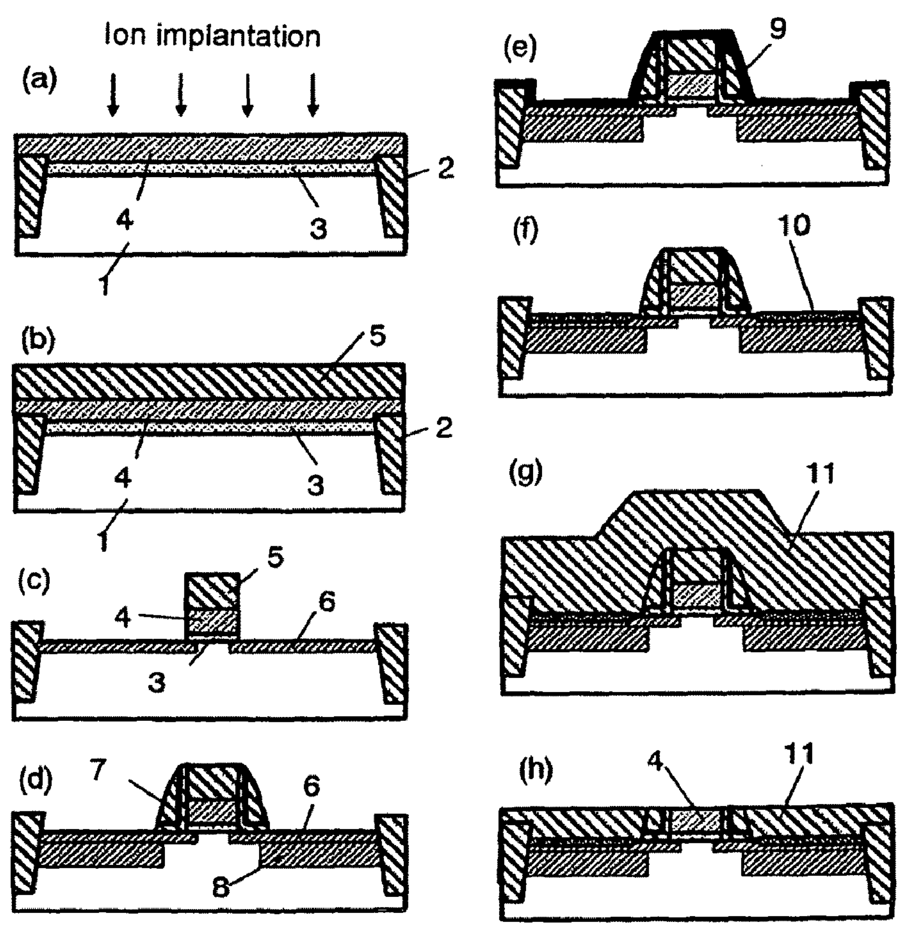
FIG. 5 is a cross-sectional view illustrating a manufacturing step of a semiconductor device for explaining the present invention.

FIGS. 5(*a*) to 5(*h*), 6(*i*) and 6(*j*) are cross-sectional views illustrating manufacturing steps of a MOSFET.

First, an element-isolating region 2 was formed in a surface region of a silicon substrate 1 using an STI (Shallow Trench Isolation) technique. Subsequently, a gate insulating film 3 made of SiON was formed on the element-isolated surface of the silicon substrate.

Next, as shown in FIG. 5(*a*), an 80 nm-thick polysilicon film 4 was formed on the gate insulating film 3. Then, different impurities were implanted into the nMOS and pMOS regions of this polysilicon film, respectively, by combining a regular PR process using a resist with ion implantation. Specifically, As was implanted into the nMOS region and B was implanted into the pMOS region. Implantation energies and dose amounts were 5 KeV and $5\times10^{15}$ cm$^{-2}$ for As implantation and 2 KeV and $6\times10^{15}$ cm$^{-2}$ for B implantation, respectively.

After that, as shown in FIG. 5(*b*), a 150 nm-thick silicon dioxide film 5 was formed.

Next, as shown in FIG. 5(*c*), a laminated film composed of the polysilicon film 4 and the silicon dioxide film 5 was processed using a lithography technique and RIE (Reactive Ion Etching) technique, thereby forming a gate electrode pattern.

Next, one of the nMOS and pMOS regions was masked and an impurity was ion-implanted into the other region using this gate electrode pattern as a mask, thereby forming an extended diffusion region 6 in a self-aligned manner. This step was carried out for the nMOS and pMOS regions, respectively.

Next, as shown in FIG. 5(*d*), a silicon nitride film and a silicon dioxide film were successively deposited, and then etched back to form a gate sidewall 7.

Next, one of the nMOS and pMOS regions was masked and an impurity was once again ion-implanted into the other region, thereby forming a source/drain diffusion region 8. This step was carried out for the nMOS and pMOS regions, respectively. The source/drain diffusion region was activated later by performing a heat treatment.

Next, as shown in FIG. 5(*e*), a 20 nm-thick metal film 9 was deposited by sputtering over the entire surface. Subsequently, an approximately 40 nm-thick silicide layer 10 was formed only in the source/drain diffusion region using a silicide technique, with the gate electrode pattern, the gate sidewall and the element-isolating region serving as masks (FIG. 5(*f*)). As this silicide layer 10, an Ni monosilicide (NiSi) layer wherewith a contact resistance can be made lowest was formed. A Co silicide or a Ti silicide may be used in place of the Ni silicide.

Next, as shown in FIG. 5(*g*), an interlayer insulating film 11 made of a silicon dioxide film was formed using a CVD (Chemical Vapor Deposition) method.

This interlayer insulating film 11 was planarized using a CMP (Chemical Mechanical Polishing) technique. Subsequently, as shown in FIG. 5(*h*), the interlayer insulating film was etched back to expose the polysilicon layer 4 of the gate electrode pattern.

Figure 6:
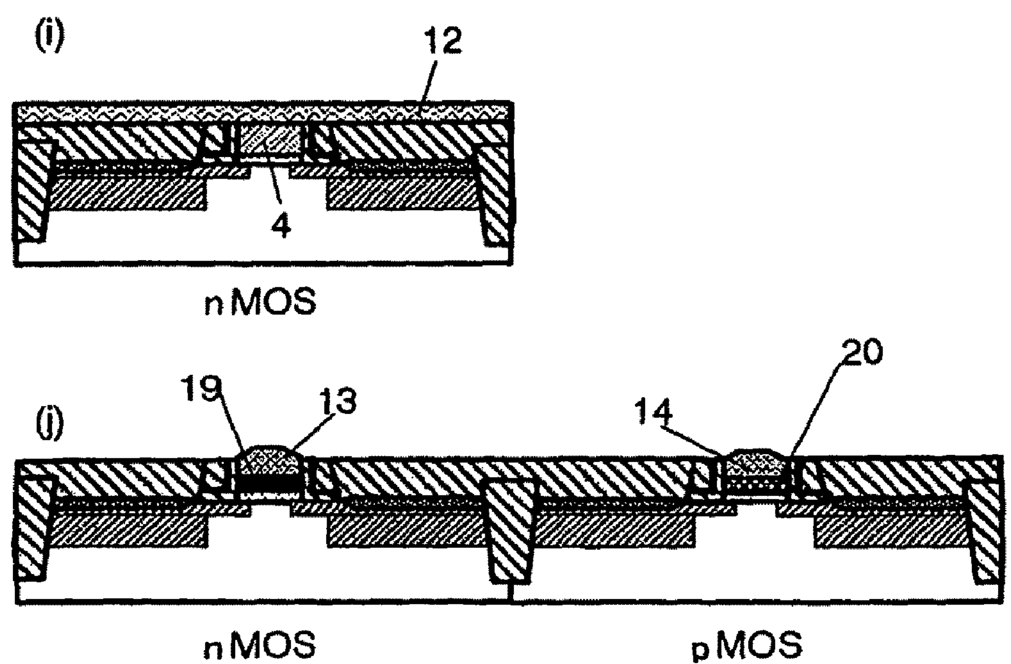
FIG. 6 is another cross-sectional view illustrating a manufacturing step of the semiconductor device for explaining the present invention.

Next, as shown in FIG. 6(*i*), an Ni film 12 for siliciding the polysilicon layer 4 of the gate electrode pattern was deposited. The thickness of the Ni film in this step was set so that, when polysilicon and Ni fully reacted with each other to form a silicide, the composition of a portion in contact with the gate insulating film turned into $NiSi_2$. In the present example of manufacture, Ni was film-formed to a thickness of 25 nm at room temperature using a DC magnetron sputtering method.

According to the present invention, a step of irradiating an Ni diffusion-preventing element to the Ni film 12 was supposed to be carried out after the formation of this Ni film. However, explanation of this irradiation step will be skipped since the present example of manufacture is intended to explain matters other than those related to this irradiation step. An example of manufacture in which this irradiation step was carried out will be described later.

After the formation of the Ni film 12, polysilicon and Ni were reacted with each other by a 650° C., 2-minute heat treatment, thereby forming gate electrodes 13 and 14 made of crystallized $NiSi_2$. In this silicidation, the additive element (As) within the silicide electrode of the nMOS region segregated in the vicinity of an electrode/insulating film boundary, as shown in FIG. 6(*j*), thus forming a layer-like impurity-segregated region 19. Likewise, the additive element (B) within the silicide electrode of the pMOS region segregated in the vicinity of an electrode/insulating film boundary, as shown in FIG. 6(*j*), thus forming a layer-like impurity-segregated region 20.

Finally, an excess Ni film that had not undergone silicidation reaction in the heat treatment step was removed by wet etching using a sulfuric acid/hydrogen peroxide mixture solution. After that, a contact plug and an upper-layer interconnect (not illustrated) were formed by following regular methods.

By going through the above-described steps, there was formed such a CMOS structure having full-silicide electrodes, in which impurity elements different between the nMOS and pMOS regions had segregated in the vicinities of electrode/insulating film boundaries, as shown in FIG. 6(*j*). In the MOSFET fabricated as described above, the effective work functions of the silicide electrodes were 4.0 eV for the nMOS and 5.2 eV for the pMOS.

Figure 7:
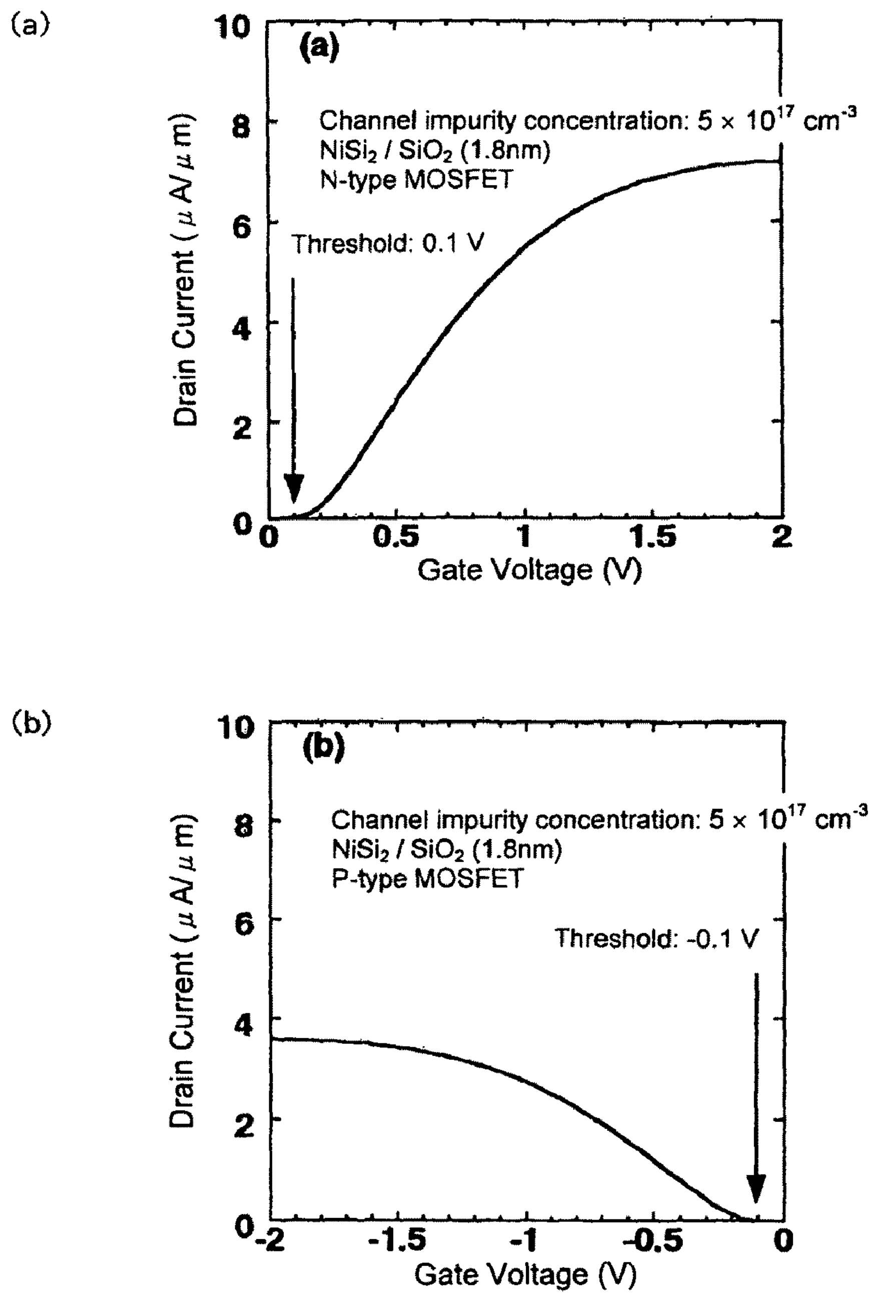
FIG. 7 is a graphical view showing the result of measuring the drain current-gate voltage characteristic of a MOSFET fabricated according to the present invention (FIG. 7(*a*) shows the measurement result of an nMOS and FIG. 7(*b*) shows the measurement result of a pMOS)

FIG. 7(*a*) shows the dependence of the drain current of an nMOS including a gate electrode ($NiSi_2$ electrode), the effective work function of which has been modulated to 4.0 eV, upon the gate voltage of the nMOS. The channel concentration is $5\times10^{17}$ cm$^{-3}$ and, therefore, the threshold predictable from the 4.0 eV effective work function in FIG. 4 is 0.1 V. From FIG. 7(*a*), the threshold of the nMOS including the $NiSi_2$ electrode agrees with 0.1 V, as predicted from the effective work function. In addition, it has been confirmed that in this transistor, it is possible to obtain the same value of electron mobility as that of a transistor using polysilicon for the gate electrode thereof and $SiO_2$ for the gate insulating film thereof.

FIG. 7(*b*) shows the dependence of the drain current of a pMOS including a gate electrode ($NiSi_2$ electrode), the effective work function of which has been modulated to 5.2 eV, upon the gate voltage of the nMOS. The channel concentration is $5\times10^{17}$ $cm^{-3}$ and, therefore, the threshold predictable from the 5.2 eV effective work function in FIG. 4 is −0.1 V. From FIG. 7(*b*), the threshold of the pMOS including the $NiSi_2$ electrode agrees with −0.1 V, as predicted from the effective work function. In addition, it has been confirmed that in this transistor, it is possible to obtain the same value of electron mobility as that of a transistor using polysilicon for the gate electrode thereof and $SiO_2$ for the gate insulating film thereof.

Note that the same effect was obtained even when a p-type dopant impurity (Al, In, Ga or TI) other than B was doped into the Ni full-silicide electrode for the pMOS and an n-type dopant impurity (N, P, Sb or Bi) other than As was doped into the Ni full-silicide electrode for the nMOS.

In addition, the gate electrodes that were made of the crystallized $NiSi_2$ electrode has excellent adhesion to a gate insulating film made of $SiO_2$ or SiON (silicon oxynitride film). Furthermore, since a gate electrode-induced stress hardly occurs, it is possible to provide a high-reliability MOSFET.

According to the present invention, it is possible to form Ni full-silicide electrodes for both the nMOS and pMOS in one step of silicidation when fabricating a CMOS device. Steps are thus simplified and, therefore, the cost of manufacture can be reduced.

As has been described heretofore, it is possible to obtain excellent transistor characteristics by combining an impurity-doped crystallized Ni full-silicide electrode ($NiSi_2$ electrode) and an SiON gate insulating film.

Comparative Examples

According to the method disclosed in JP2005-129551-A, a polysilicon film was formed on a silicon substrate through a thermally-oxidized film. An Ni film was formed on the polysilicon film and a 400° C., 1-minute heat treatment was performed to cause a silicidation reaction, thereby fabricating a MOS capacitor. In such a manner, Ni films having different thickness were formed on polysilicon films having the same thickness, and heat-treated, thereby forming silicided layers having different Ni content. Each impurity concentration near a boundary with the insulating film in the silicided layer was no lower than $10^{21}$ $cm^{-3}$.

XRD spectrum measurements of the formed silicided layers showed that, particularly in a case where nickel film thickness ($T_{Ni}$)/polysilicon film thickness ($T_{Si}$)<0.55, any peaks associated with crystallization were not observed or peak intensity was extremely low. This means that the formed silicided layers were noncrystalline or that the crystal qualities of the silicided layers were extremely low.

Figure 8:
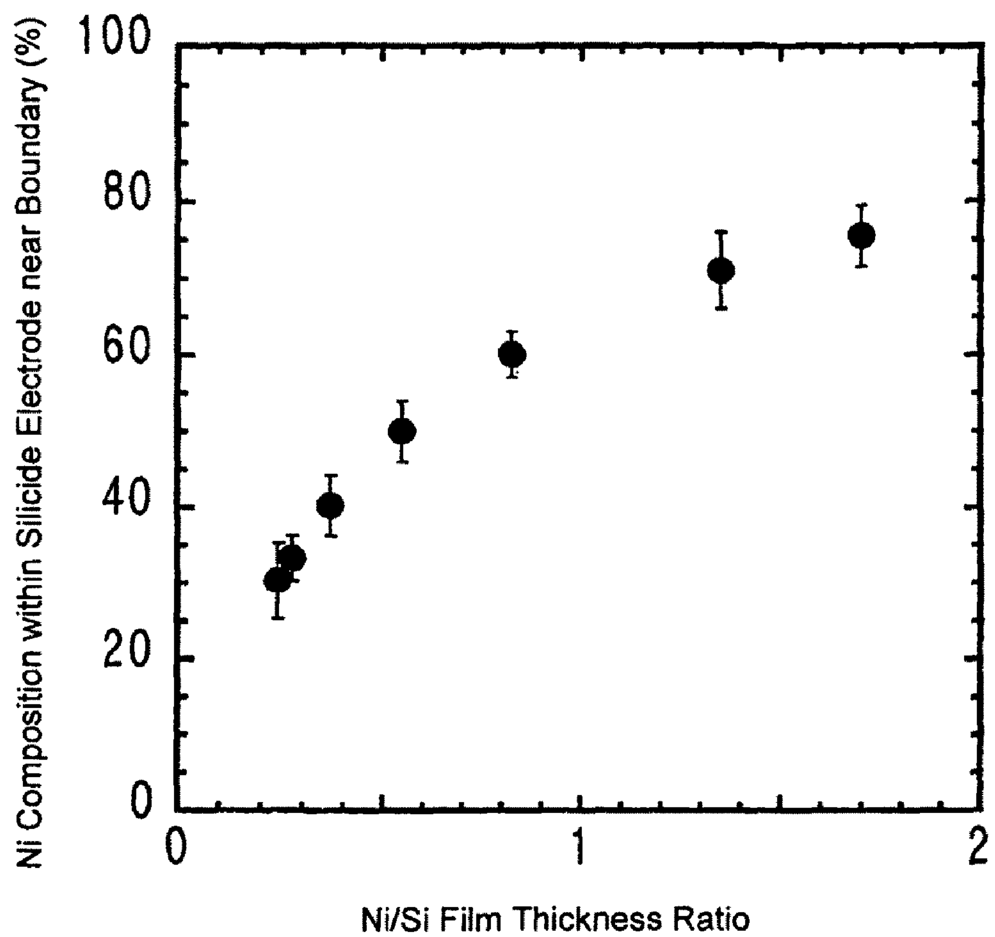
FIG. 8 is a graphical view showing a relationship between an Ni silicide composition in accordance with the related art (comparative example) and the film thickness ratio of Ni to polysilicon before silicidation.

FIG. 8 shows a relationship between the Ni composition (composition near a boundary between the silicided layer and the insulating film) of the silicided layer (silicide electrode) of each MOS capacitor described above and the Ni/polysilicon film thickness ratio ($T_{Ni}/T_{Si}$) before silicidation. This Ni composition was determined from an XPS measurement. An error bar in the Ni composition of the figure represents a variation in XPS-based multipoint measurement. From this figure, it is understood that the Ni composition of the silicided layer changes continuously according to the $T_{Ni}/T_{Si}$ ratio.

Figure 9:
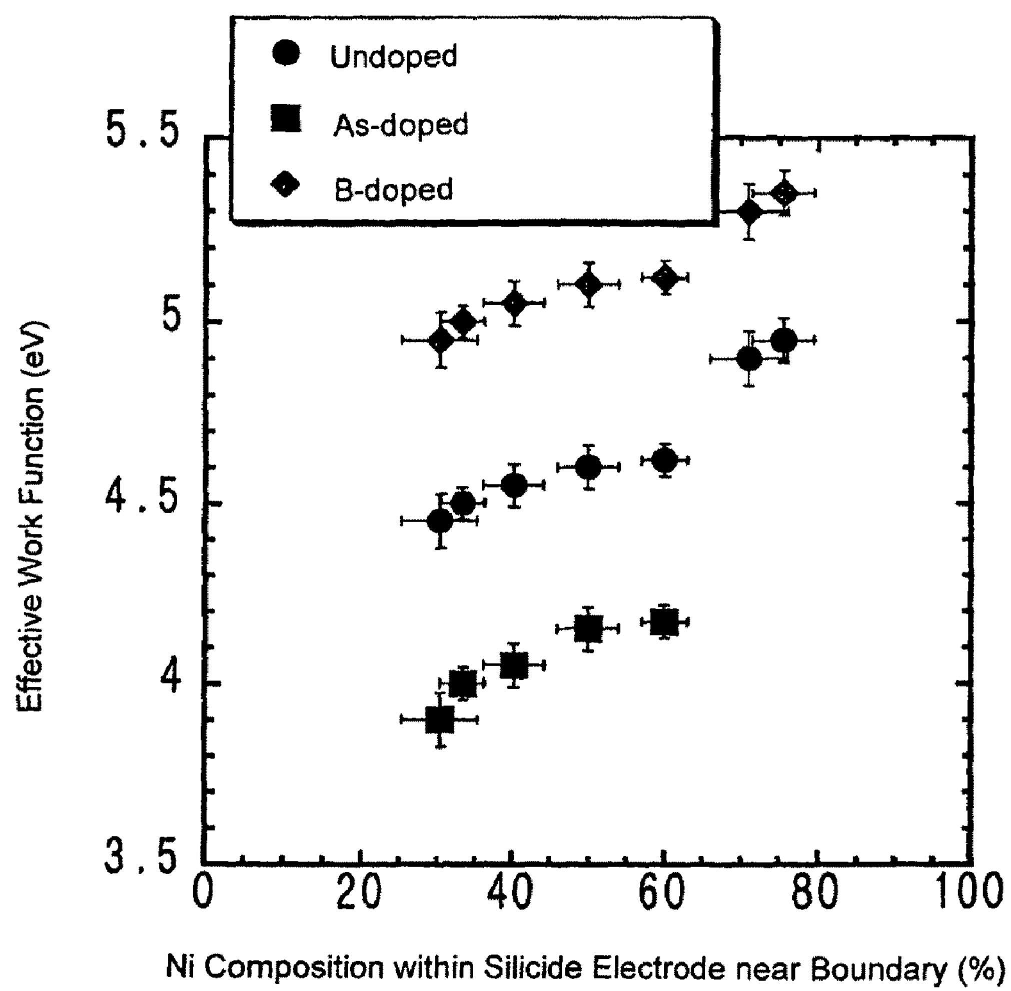
FIG. 9 is a graphical view showing a relationship between the effective work function and the Ni composition of an Ni silicide in accordance with the related art (comparative example)

FIG. 9 shows the effective work functions of As-doped, B-doped and impurity-undoped silicided layers. From this figure, it is understood that in the case of non-doping, the effective work function of the silicided layer increases as the Ni composition thereof increases. Accordingly, if the Ni composition varies, for example, ±5% or so, a threshold variation of approximately 0.1 to 0.2 V takes place. This tendency completely differs from that of the above-described crystallized Ni full-silicide electrode formed according to the present invention. Such a difference between changes in effective work functions due to composition probably stems from a difference in crystal quality due to a difference between formation methods. In the method described in JP2005-129551-A, silicidation is performed by 400° C., 1-minute heating and the silicided layer thus obtained is non-crystalline or extremely low in crystal quality, as described above. On the other hand, silicidation conditions in the present invention were 400° C., 5 minutes in the case of $T_{Ni}/T_{Si}\geqq0.55$ and 650° C., 2 minutes in the case of $T_{Ni}/T_{Si}<0.55$. Consequently, an Ni silicide electrode having excellent crystal quality was formed. Particularly in the case of $T_{Ni}/T_{Si}<0.55$, an excellent Ni silicide electrode having high crystal quality was formed.

FIG. 9 also shows the effective work functions of impurity (As and B)-doped silicided layers formed using the method described in JP2005-129551-A. As is understood from this figure, the effective work function also increases as the Ni composition of a silicided layer which is a main body increases, also when an impurity is doped. That is, no increase according to the Ni composition is seen in a change (difference between cases when an impurity is doped and not doped) in the effective work function. This tendency completely differs from that of the crystallized Ni full-silicide electrode formed according to the present invention. That is, in the crystallized Ni full-silicide electrode according to the present invention, the change in the effective work function increases as the Ni composition decreases (Si composition increases). Such a difference in the dependency of a change in the effective work function due to doping upon the electrode composition probably stems from a difference in crystal quality due to a difference between formation methods, as with the above-described case of non-doping.

As the effective work function of an impurity-doped silicided layer formed using the method described in JP2005-129551-A, an effective work function of approximately 4.1 eV has been obtained when the Ni composition is 30 to 60 atom % and contains an n-type impurity. In contrast, an effective work function of approximately 5.1 eV has been obtained when the Ni composition is 40 to 70 atom % and contains a p-type impurity. However, there have not been obtained any Ni silicide electrodes having effective work functions (4.0 eV for the nMOS and 5.2 eV for the pMOS) wherewith thresholds required of a high-performance nMOS and pMOS can be realized. In addition, the adhesion of Ni to an $SiO_2$ gate insulating film was extremely low particularly when the Ni composition was 40 atom % or higher. Thus, separation occurred frequently in a silicided layer/insulating film boundary. Furthermore, if the Ni composition is 40 atom % or higher, a silicided layer-induced compressive stress is applied to the insulating film, thus degrading the reliability of the gate insulating film.

Figure 10:
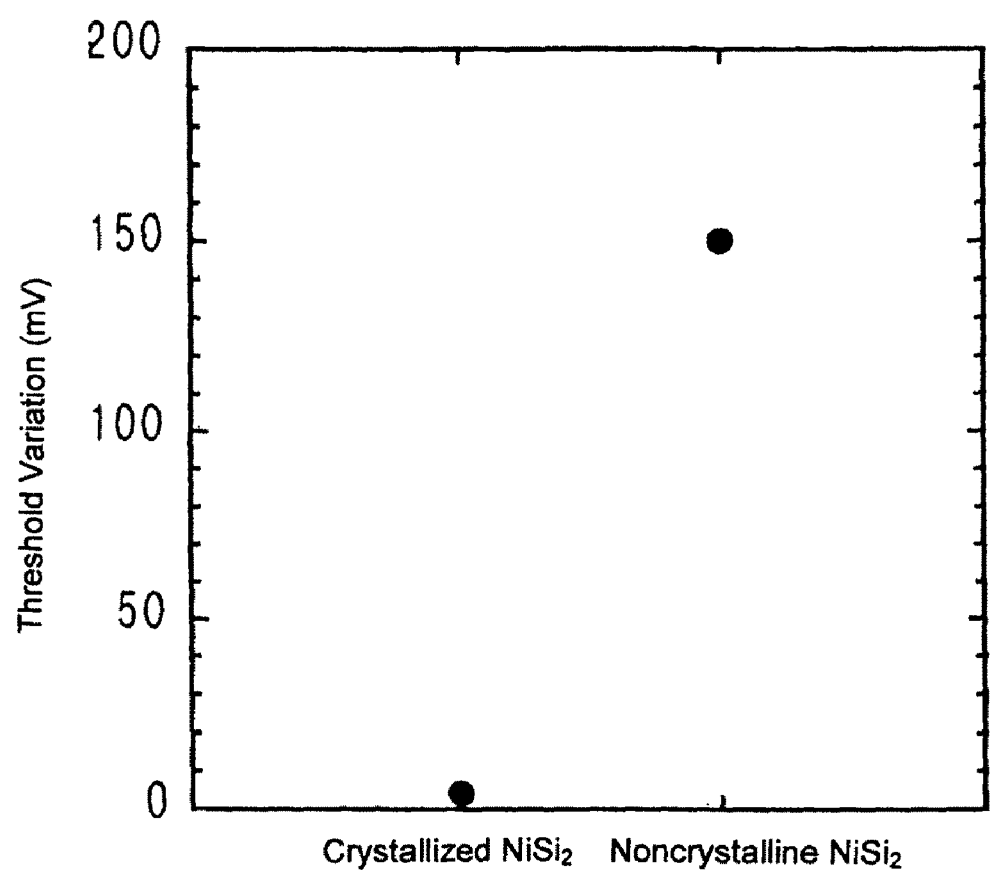
FIG. 10 is a graphical view showing variations in the thresholds of transistors fabricated according to the present invention and the related art (comparative example)

In addition, an impurity-doped silicided layer formed using the method described in JP2005-129551-A is not an Ni silicide of stoichiometric composition, as is also described in this publication. Accordingly, a composition distribution within the layer varies due to a heat treatment after forming the layer. As a result, there was observed a significant variation in the effective work function. FIG. 10 shows a threshold variation when an impurity-doped crystallized $NiSi_2$ formed according to the present invention was used and a threshold variation when an impurity-doped silicided layer (the Ni composition of which was 33.3%, the same as that of $NiSi_2$) formed using the method described in JP2005-129551-A was used. The absolute amounts of variation were 4 mV when the method of the present invention was followed and 150 mV when the method described in JP2005-129551-A was followed.

Example of Manufacture 2

Figure 11:
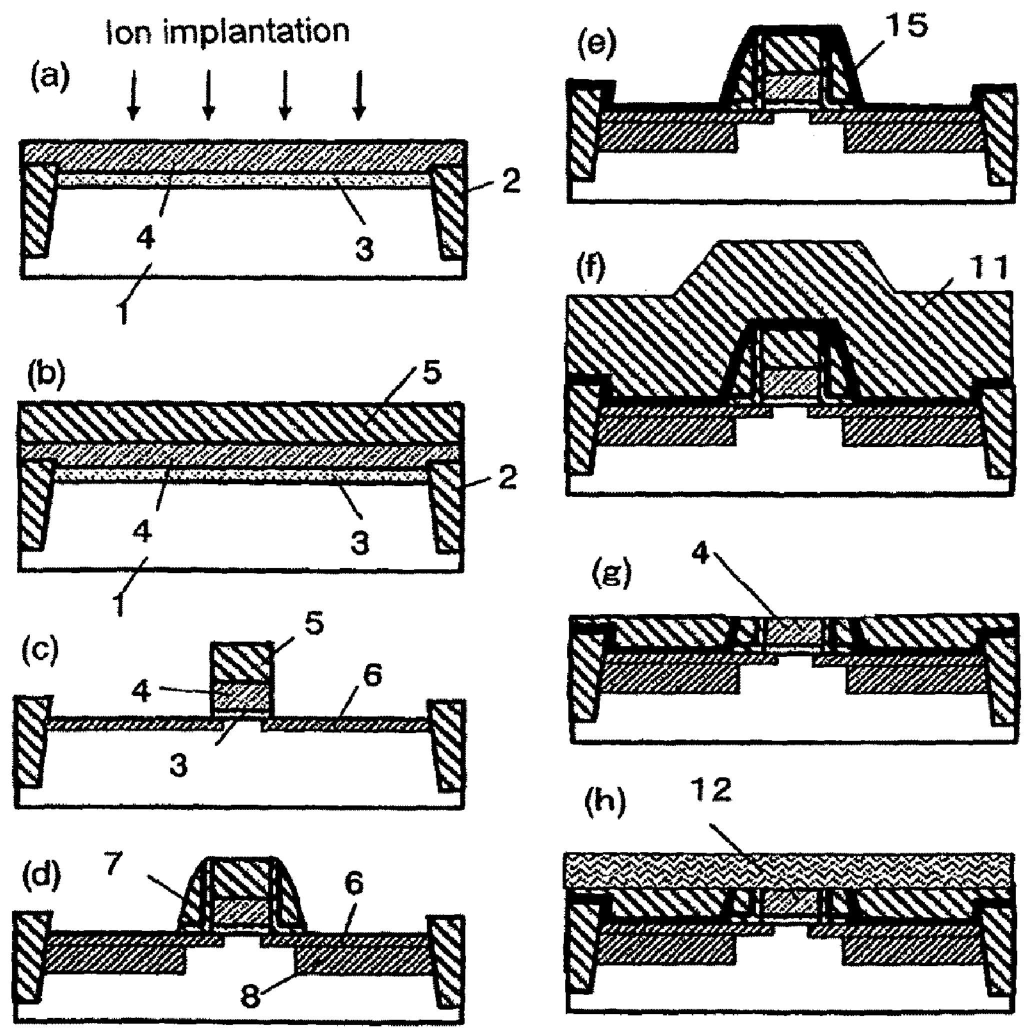
FIG. 11 is a cross-sectional process drawing illustrating a method for manufacturing a semiconductor device in accordance with the present invention.

FIGS. 11(*a*) to 11(*h*), 12(*i*) to 12(*k*), and 13(*l*) to 13(*n*) are cross-sectional views illustrating manufacturing steps of a MOSFET.

The present example of manufacture includes forming a silicide layer in a source/drain diffusion region after silicidation for gate electrode formation, and forming a silicon nitride film intended to apply a strain to the channel of the MOSFET and thereby improve the electron mobility thereof.

Steps up to forming the source/drain diffusion region (FIG. 11(*a*) to 11(*d*)) are the same as those of the above-described example of manufacture 1 (FIGS. 6(*a*) to 6(*d*)) and, therefore, will not be explained again. Thus, an explanation will be made of the next (FIG. 11(*e*)) and subsequent steps. In the present example of manufacture, Sb was doped into the polysilicon film of the nMOS region and In was doped into the polysilicon film of the pMOS region.

As shown in FIG. 11(*e*), using a CVD method, a silicon nitride film 15 was formed on the entire surface. This nitride film has the function of protecting the substrate and the like when an interlayer insulating film 11 is removed later by a wet etching treatment.

Next, as shown in FIG. 11(*f*), the interlayer insulating film 11 made of a silicon dioxide film was formed using a CVD method.

This interlayer insulating film 11 was planarized using a CMP technique. Subsequently, as shown in FIG. 11(*g*), the interlayer insulating film was etched back to expose the polysilicon layer 4 of the gate electrode pattern.

Next, as shown in FIG. 11(*h*), there was deposited an Ni film 12 for siliciding the polysilicon layer 4 of the gate electrode pattern. The thickness of the Ni film in this step was set so that when polysilicon and Ni fully reacted with each other to form a silicide, the composition of a portion in contact with the gate insulating film turned into $NiSi_2$. In the present example of manufacture, Ni was film-formed to a thickness of 25 nm at room temperature using a DC magnetron sputtering method.

According to the present invention, a step of irradiating an Ni diffusion-preventing element to the Ni film 12 was supposed to be carried out after the formation of this Ni film. However, explanation of this irradiation step will be skipped since the present example of manufacture is intended to explain matters other than those related to this irradiation step. An example of manufacture in which this irradiation step was carried out will be described later.

Figure 12:
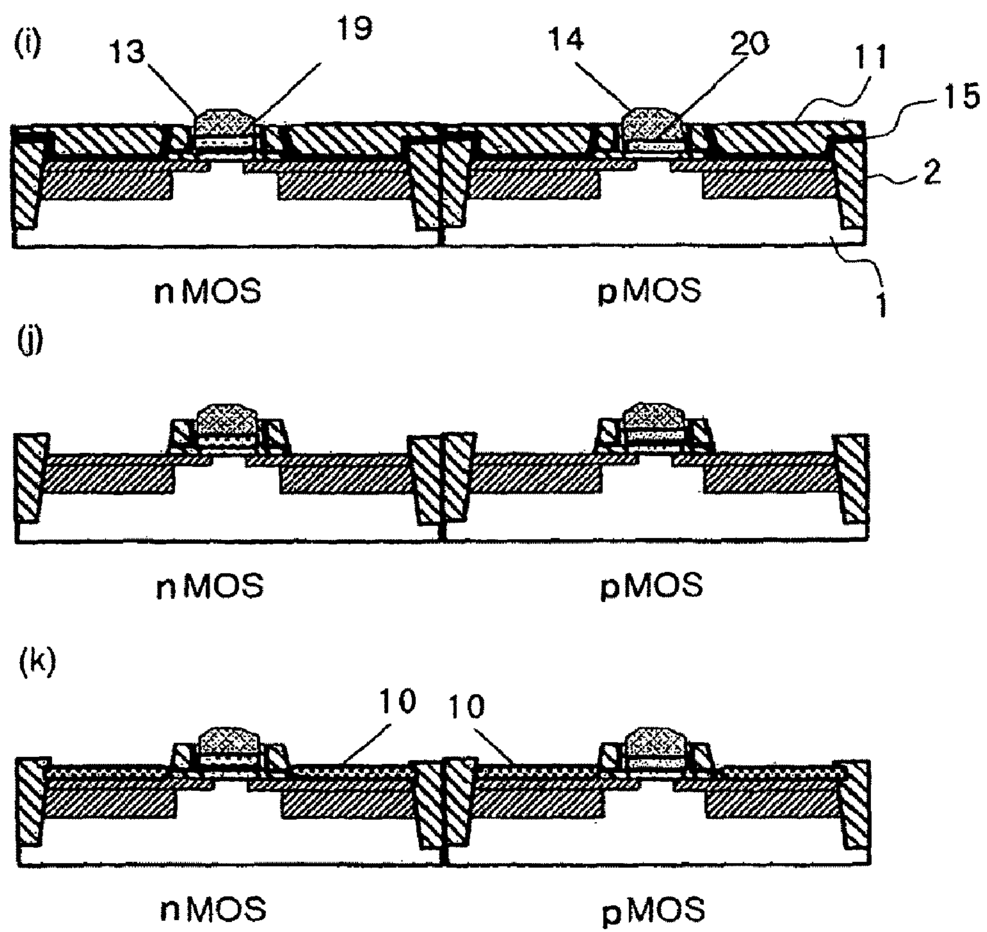
FIG. 12 is another cross-sectional process drawing illustrating the method for manufacturing the semiconductor device in accordance with the present invention.

After the formation of the Ni film 12, polysilicon and Ni were reacted with each other by a 650° C., 2-minute heat treatment to form gate electrodes 13 and 14 made of crystallized $NiSi_2$. In this silicidation, the additive element (Sb) within the silicide electrode of the nMOS region segregated in the vicinity of an electrode/insulating film boundary, as shown in FIG. 12(*i*), thus forming a layer-like impurity-segregated region 19. Likewise, the additive element (In) within the silicide electrode of the pMOS region segregated in the vicinity of an electrode/insulating film boundary, as shown in FIG. 12(*i*), thus forming a layer-like impurity-segregated region 20.

After that, an excess Ni film that had not undergone silicidation reaction in the heat treatment step was removed by wet etching using a sulfuric acid-hydrogen peroxide mixture solution.

Next, as shown in FIG. 12(*j*), the interlayer insulating film 11 was removed using a hydrofluoric acid solution. Subsequently, the silicon nitride film 15 was removed using phosphoric acid.

Next, a 20 nm-thick metal film was deposited by sputtering over the entire surface. Then, an approximately 40 nm-thick silicide layer 10 was formed only in the source/drain diffusion region using a silicide technique, with the gate electrode, the gate sidewall and the element-isolating region serving as masks (FIG. 12(*k*)). As this silicide layer 10, an Ni monosilicide (NiSi) layer wherewith a contact resistance can be made lowest was formed. A Co silicide or a Ti silicide may be used in place of the Ni silicide.

Figure 13:
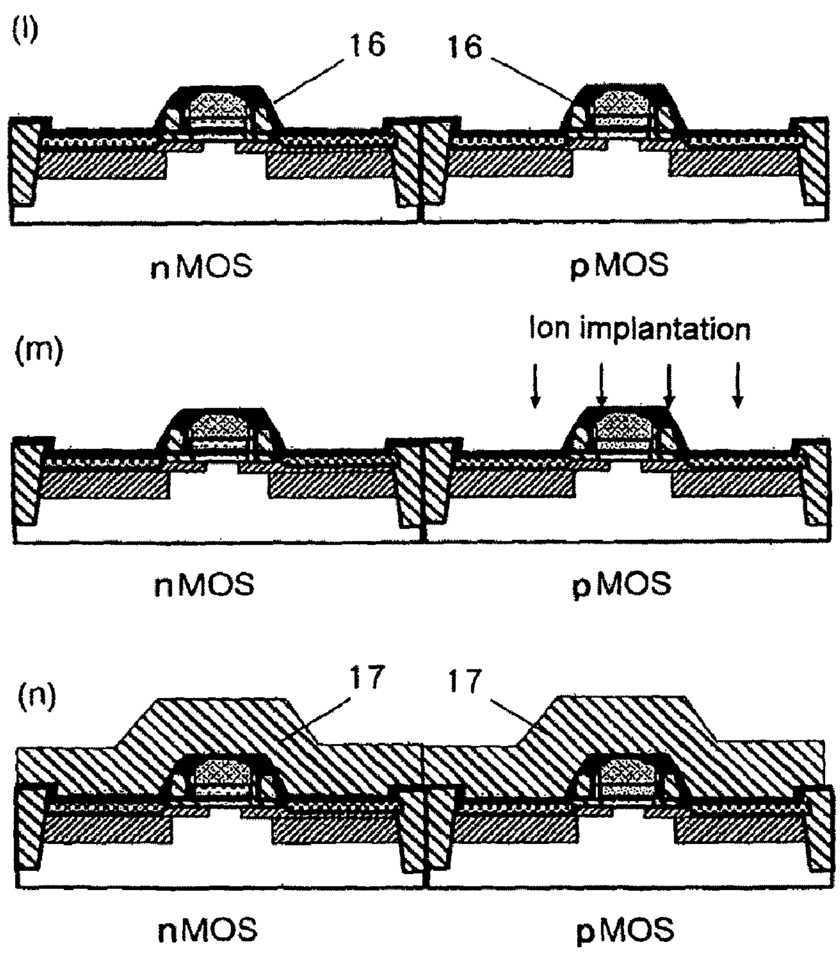
FIG. 13 is yet another cross-sectional process drawing illustrating the method for manufacturing the semiconductor device in accordance with the present invention.

Next, as shown in FIG. 13(*l*), a silicon nitride film 16 was formed over the entire surface using a CVD method, in order to apply a tensile stress to an n-type channel and thereby improve the electron mobility thereof.

Next, as shown in FIG. 13(*m*), ion implantation was performed on the silicon nitride film 16 on the pMOS region by combining a regular PR process using a resist with ion implantation, thereby alleviating the stress of the silicon nitride film 16.

Next, as shown in FIG. 13(*n*), an interlayer insulating film 17 made of a silicon dioxide film was formed using a CVD method.

Finally, a contact plug and an upper-layer interconnect (not illustrated) were formed by following regular methods. Thus, there was formed a CMOS structure having the full-silicide electrodes 13 and 14, in which impurities different between the nMOS and pMOS regions had segregated in the vicinities of electrode/insulating film boundaries. In the MOSFET fabricated as described above, the effective work functions of the full-silicide electrode 13 were 4.0 eV for the nMOS and 5.2 eV for the pMOS.

Also in the present example of manufacture, it was confirmed that as with the above-described example of manufacture 1, the thresholds were 0.1 V for the nMOS and −0.1 V for the pMOS, as predicted from the effective work functions. In addition, it was confirmed that in these transistors, it was possible to obtain the same value of electron mobility as that of a transistor using polysilicon for the gate electrode thereof and $SiO_2$ for the gate insulating film thereof.

Note that the same effect was obtained even when a p-type dopant impurity (B, Al, Ga or Tl) other than In was doped into the Ni full-silicide electrode for the pMOS and an n-type dopant impurity (N, P, As or Bi) other than Sb was doped into the Ni full-silicide electrode for the nMOS.

As has been described heretofore, it is possible to obtain excellent transistor characteristics by combining an impurity-doped crystallized Ni full-silicide electrode ($NiSi_2$ electrode) and an SiON gate insulating film.

Example of Manufacture 3

A method for manufacturing the CMOS structure illustrated in FIG. 1 will be described using FIG. 16.

First, there is prepared a semiconductor substrate 1 including an element-isolating region 2 formed using an STI technique and p-type and n-type active regions.

Next, a gate insulating film 3 made of a silicon dioxide film is formed on a surface of this silicon substrate.

Subsequently, a 60 nm-thick polysilicon film 4 is deposited using a CVD method on this gate insulating film 3. Then, as with the example of manufacture 1, different impurities are ion-implanted into nMOS and pMOS regions, respectively, by combining a regular PR process using a resist with ion implantation. After that, a 20 nm-thick silicon dioxide film 5 to be used as a mask is formed. A noncrystalline silicon film or a laminated film composed of a polysilicon film and an noncrystalline silicon film may be used in place of the polysilicon film 4.

Next, the laminated film (gate insulating film 3, polysilicon film 4 and silicon dioxide film 5) on the silicon substrate is processed into a gate electrode pattern using a lithography technique and an RIE technique.

Next, one of the nMOS and pMOS regions is masked and an impurity is ion-implanted into the other region using this gate electrode pattern as a mask, thereby forming an extended diffusion region 6 in a self-aligned manner. This step is carried out for the nMOS and pMOS regions, respectively.

Next, a silicon dioxide film is deposited using a CVD method, so as to cover the gate electrode pattern, and then the silicon dioxide film is etched back to form a gate sidewall 7.

Next, one of the nMOS and pMOS regions is masked an impurity is once again ion-implanted into the other region, thereby forming a source/drain diffusion region 8. This step is carried out for the nMOS and pMOS regions, respectively. The source/drain diffusion region is activated later by performing a heat treatment.

Figure 16:
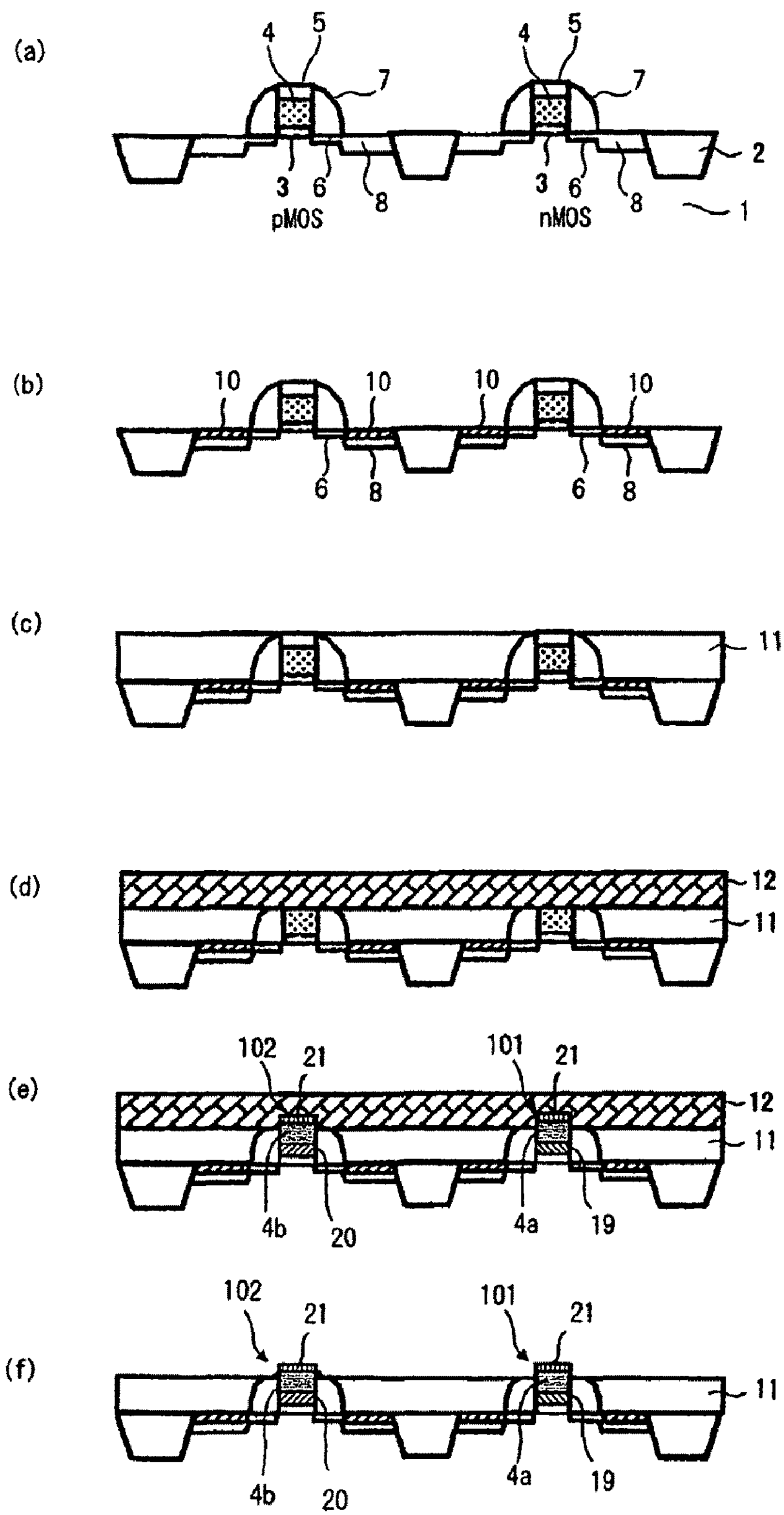
FIG. 16 is a cross-sectional process drawing illustrating a method for manufacturing a semiconductor device in accordance with the present invention.

By going through the above-described steps, it is possible to obtain the structure illustrated in FIG. 16(*a*).

Next, a nickel film is deposited over the entire surface. Subsequently, as shown in FIG. 16(*b*), an Ni silicide layer 10 is formed only in the source/drain diffusion region using a salicide technique, with the gate electrode pattern, the gate sidewall and the element-isolating region serving as masks. In the present example of manufacture, a nickel monosilicide (NiSi) layer wherewith a contact resistance can be made lowest is formed as this Ni silicide layer 10. A Co silicide or a Ti silicide may be formed in place of this Ni monosilicide layer.

Next, an interlayer insulating film 11 made of a silicon dioxide film is formed using a CVD method, so as to bury the gate electrode pattern. Then, as shown in FIG. 16(*c*), the surface of this interlayer insulating film 11 is planarized using a CMP technique.

Next, the interlayer insulating film 11 is etched back such that silicon dioxide film 5 on the gate electrode pattern is removed to expose the polysilicon layer 4. Then, as shown in FIG. 16(*d*), an Ni film 12 for siliciding the polysilicon layer 4 of the gate electrode pattern is formed over the entire surface. This Ni film is set to a film thickness at which the whole of the polysilicon layer 4 is silicided by a later heat treatment for silicidation.

Next, an Ni diffusion-preventing element is irradiated over the entire surface and thus doped into the Ni film. In the present example of manufacture, nitrogen plasma irradiation is performed. The Ni diffusion-preventing element may be doped by ion implantation instead of plasma irradiation. At this time, irradiation conditions are adjusted so that the Ni diffusion-preventing element does not penetrate through the Ni film 12 and reach the polysilicon layer 4, i.e., the element stays within the Ni film. In addition, the irradiation is preferably performed under an inert atmosphere, and more preferably under a nitrogen atmosphere, from the viewpoint of preventing Ni oxidization. As has been explained using FIG. 14, it is possible to adjust the rate of Ni diffusion from the Ni film 12 into the polysilicon layer 4 due to a later heat treatment, by using the irradiation time of the Ni diffusion-preventing element. The irradiation time of nitrogen plasma is set so that the Ni diffusion is suppressed and an $NiSi_2$ crystal phase is formed in a heat treatment (350 to 500° C.) for silicidation.

Next, a heat treatment for silicidation is performed to silicide the polysilicon layer 4, thereby forming a gate electrode 101 for the nMOS and a gate electrode 102 for the pMOS (FIG. 16(*e*)). In this silicidation, an additive element (As) within the polysilicon electrode of the nMOS region segregates in the vicinity of a gate electrode/insulating film boundary, thus forming a layer-like impurity-segregated region 19. Likewise, an additive element (B) within the polysilicon electrode of the pMOS region segregates in the vicinity of a gate electrode/insulating film boundary, thus forming a layer-like impurity-segregated region 20.

This heat treatment is preferably performed in an inert atmosphere, in order to prevent the oxidization of the Ni film 12. In addition, this heat treatment needs to be performed at a temperature at which there is obtained a diffusion rate high enough to silicide the entire region of the polysilicon layer 4 as far as to reach the gate insulating film 3, and at which the silicide layer 10 formed in the source/drain diffusion region 8 does not have a high resistance. In the present example of manufacture, heat treatment conditions are preferably set to a nitrogen gas atmosphere and a temperature range of 350 to 500° C. since the silicide layer 10 formed in the source/drain diffusion region 8 is made of nickel monosilicide (NiSi). Since the Ni diffusion-preventing element (N) contained in the Ni film 12 prevents Ni diffusion from the Ni film 12 into the polysilicon layer 4 during this heat treatment for silicidation, it is possible to form an $NiSi_2$ crystal phase at a relatively low temperature (350 to 500° C.).

Next, an excess Ni film that has not undergone silicidation reaction in this heat treatment is removed by wet etching. By using a sulfuric acid-hydrogen peroxide mixture solution, it is possible to easily remove the Ni film without causing damage to the gate electrode.

Next, as shown in FIG. 1, an interlayer insulating film 24 is formed, and then planarized by CMP. Then, steps of forming a contact plug and an upper-layer interconnect are carried by following regular methods. Hereafter, it is possible to form a desired semiconductor device by following a regular process.

In the present example of manufacture, a barrier layer region 21 containing the Ni diffusion-preventing element (N) irradiated to the Ni film 12, the Ni element in the Ni film, and silicon (Si) is formed in the vicinity of a boundary between the Ni film and the gate electrode, as has been explained using FIG. 15. As a result, it is possible to prevent the outward diffusion of the Ni element and an impurity element from within the silicide electrode into a contact interconnect, thereby stabilizing thresholds. In addition, it is possible to realize low thresholds since the gate electrode is composed of an impurity-containing $NiSi_2$ crystal phase, as has been explained using FIG. 3. Furthermore, this barrier layer region 21 prevents the diffusion of the Ni element from the Ni film 12 into the polysilicon layer 4 and the formed silicide region in a heat treatment step for silicidation. In addition, the degree of the diffusion can be adjusted according to an irradiation time. Accordingly, it is possible to form the $NiSi_2$ crystal phase at a relatively low temperature (350 to 500° C.). As a result, the nickel monosilicide (NiSi) formed in the source/drain diffusion region is prevented from having a high resistance. Thus, it is possible to fabricate a semiconductor device with an excellent yield.

While exemplary embodiments have been heretofore described, the present invention is not limited to the above-described exemplary embodiments but may be carried out by selecting materials and structures as appropriate, without departing from the subject matter thereof.

For example, a so-called high-dielectric gate insulating film, such as HfSiON, may be used as the gate insulating film if a gate leakage current needs to be reduced. In this case, a threshold change decreases, compared with a case in which a silicon dioxide film or a silicon oxynitride film is used. It is possible, however, to lower the effective work function by interposing a silicon dioxide film, a silicon oxynitride film or a silicon nitride film in a portion in contact with the gate electrode. As a result, it is possible to realize low thresholds.

The invention claimed is:

1. A semiconductor device comprising:

a silicon substrate;

an N-channel field-effect transistor including a first gate insulating film on said silicon substrate, a first gate electrode on said first gate insulating film, and a first source/drain region; and a P-channel field-effect transistor including a second gate insulating film on said silicon substrate, a second gate electrode on said second gate insulating film, and a second source/drain region;

wherein each of said first and second gate electrodes comprises:

a crystallized nickel silicide region containing an impurity element, the crystallized nickel silicide region being contact with the first or second gate insulating film; and a barrier layer region in an upper portion including an upper surface of said gate electrode, the barrier layer region containing an Ni diffusion-preventing element higher in concentration than that of a lower portion below the upper portion.

2. The semiconductor device according to claim 1, wherein said Ni diffusion-preventing element is at least either one of a nitrogen atom and an oxygen atom.

3. The semiconductor device according to claim 1, wherein the concentration of the Ni diffusion-preventing element of said barrier layer region is 0.1 to 10 atom %.

4. The semiconductor device according to claim 1, wherein the thickness of said barrier layer region in a direction perpendicular to said silicon substrate is 1 to 10 nm.

5. The semiconductor device according to claim 1, wherein said crystallized nickel silicide region of said first gate electrode contains an n-type impurity, and said crystallized nickel silicide region of said second gate electrode contains a p-type impurity and has the same nickel silicide composition as said crystallized nickel silicide region of said first gate electrode.

6. The semiconductor device according to claim 1, wherein a silicide composing each of said crystallized nickel silicide regions has a composition represented as $Ni_xSi_{1-x}$ ($0.2 \leqq x < 0.4$).

7. The semiconductor device according to claim 1, wherein a silicide composing each of said crystallized nickel silicide regions includes an $NiSi_2$ crystal phase.

8. The semiconductor device according to claim 1, wherein said first gate electrode includes, in a portion contact with said first gate insulating film, a region containing an n-type impurity higher in concentration than that of an upper portion above the region and said second gate electrode includes, in a portion contact with said second gate insulating film, a region containing a p-type impurity higher in concentration than that of an upper portion above the region.

9. The semiconductor device according to claim 1, wherein said first gate electrode includes, in a portion contact with said first gate insulating film, a region having an n-type impurity concentration of $1\times10^{20}$ $cm^{-3}$ or higher and said second gate electrode includes, in a portion contact with said second gate insulating film, a region having an p-type impurity concentration of $1\times10^{20}$ $cm^{-3}$ or higher.

10. The semiconductor device according to claim 1, wherein each of said first and second gate insulating films includes either one of a silicon dioxide film, a silicon oxynitride film and a silicon nitride film, the film being contact with said first or second gate electrode.

11. A method for manufacturing a semiconductor device as recited in claim 1, comprising:

preparing a silicon substrate including a p-type active region and an n-type active region;

forming an insulating film for first and second gate insulating films on said silicon substrate;

forming a silicon film for gate electrodes on said insulating film;

doping an n-type impurity into said silicon film for gate electrodes in a region where an N-channel field-effect transistor is to be formed;

doping a p-type impurity into said silicon film for gate electrodes in a region where a P-channel field-effect transistor is to be formed;

processing said silicon film for gate electrodes to form a gate pattern;

forming a first source/drain region in a region where the N-channel field-effect transistor is to be formed;

forming a second source/drain region in a region where the P-channel field-effect transistor is to be formed;

forming an interlayer insulating film over said gate pattern;

removing an upper-layer portion of said interlayer insulating film such that said gate pattern is exposed;

forming a nickel film on said exposed gate pattern;

irradiating an Ni diffusion-preventing element to an entire surface of said nickel film;

forming first and second gate electrodes by performing a heat treatment and thereby siliciding said gate pattern; and removing an unsilicided excess nickel of said nickel film.

12. The method for manufacturing a semiconductor device according to claim 11, wherein said Ni diffusion-preventing element is at least either one of a nitrogen atom and an oxygen atom.

13. The method for manufacturing a semiconductor device according to claim 11, wherein the irradiation of said Ni diffusion-preventing element is performed using a plasma irradiation method or an ion implantation method.

14. The semiconductor device according to claim 2, wherein the concentration of the Ni diffusion-preventing element of said barrier layer region is 0.1 to 10 atom %.

15. The semiconductor device according to claim 2, wherein the thickness of said barrier layer region in a direction perpendicular to said silicon substrate is 1 to 10 nm.

16. The semiconductor device according to claim 3, wherein the thickness of said barrier layer region in a direction perpendicular to said silicon substrate is 1 to 10 nm.

17. The semiconductor device according to claim 2, wherein said crystallized nickel silicide region of said first gate electrode contains an n-type impurity, and said crystallized nickel silicide region of said second gate electrode contains a p-type impurity and has the same nickel silicide composition as said crystallized nickel silicide region of said first gate electrode.

18. The semiconductor device according to claim 3, wherein said crystallized nickel silicide region of said first gate electrode contains an n-type impurity, and said crystallized nickel silicide region of said second gate electrode contains a p-type impurity and has the same nickel silicide composition as said crystallized nickel silicide region of said first gate electrode.

19. The semiconductor device according to claim 3, wherein said crystallized nickel silicide region of said first gate electrode contains an n-type impurity, and said crystallized nickel silicide region of said second gate electrode contains a p-type impurity and has the same nickel silicide composition as said crystallized nickel silicide region of said first gate electrode.

20. The semiconductor device according to claim 2, wherein a silicide composing each of said crystallized nickel silicide regions has a composition represented as $Ni_xSi_{1i-x}$ ($0.2 \leqq x < 0.4$).

* * * * *